(12) United States Patent
Rolston et al.

(10) Patent No.: US 7,820,462 B2
(45) Date of Patent: Oct. 26, 2010

(54) ENCAPSULATED OPTICAL PACKAGE

(75) Inventors: David Robert Cameron Rolston, Beaconsfield (CA); Tomasz Maj, Montreal (CA); Shao-Wei Fu, Montreal-West (CA)

(73) Assignee: Reflex Photonics Inc., Montreal, Quebec (CA)

( * ) Notice: Subject to any disclaimer, the term of this patent is extended or adjusted under 35 U.S.C. 154(b) by 617 days.

(21) Appl. No.: 11/569,751

(22) PCT Filed: Jul. 26, 2004

(86) PCT No.: PCT/CA2004/001408

§ 371 (c)(1),
(2), (4) Date: Nov. 29, 2006

(87) PCT Pub. No.: WO2005/010580

PCT Pub. Date: Feb. 3, 2005

(65) Prior Publication Data

US 2008/0211048 A1    Sep. 4, 2008

(51) Int. Cl.
*H01L 21/66*   (2006.01)
*G01R 31/26*   (2006.01)
*G02B 6/36*    (2006.01)

(52) U.S. Cl. .............................. 438/29; 385/88; 385/89; 385/94

(58) Field of Classification Search .................... 438/29

See application file for complete search history.

(56) References Cited

U.S. PATENT DOCUMENTS

| 4,130,343 | A | 12/1978 | Miller et al. |
|---|---|---|---|
| 5,960,141 | A | 9/1999 | Sasaki et al. |
| 6,054,716 | A | 4/2000 | Sonobe et al. |
| 6,170,996 | B1 | 1/2001 | Miura et al. |
| 6,269,209 | B1 | 7/2001 | Terada et al. |
| 2002/0001869 | A1 | 1/2002 | Fjelstad |
| 2002/0181899 | A1* | 12/2002 | Tartaglia et al. ............... 385/89 |
| 2004/0114859 | A1 | 6/2004 | Colgan et al. |

FOREIGN PATENT DOCUMENTS

| EP | 0466950 | 7/1998 |
|---|---|---|
| WO | WO0031771 | 6/2000 |
| WO | WO0173492 | 10/2001 |
| WO | WO03021329 | 3/2003 |

OTHER PUBLICATIONS

Supplementary European Search Report dated Feb. 11, 2009 from the European Application No. EP04728016.

* cited by examiner

*Primary Examiner*—Ha Tran T Nguyen
*Assistant Examiner*—Valerie Brown
(74) *Attorney, Agent, or Firm*—Ogilvy Renault LLP

(57) ABSTRACT

A method for providing an encapsulated optoelectronic chip is provided. The optoelectronic chip is secured on a substrate. A translucent coating substance is then applied on said optoelectronic chip and the translucent coating substance is then polished away to enable an optical coupling.

12 Claims, 29 Drawing Sheets

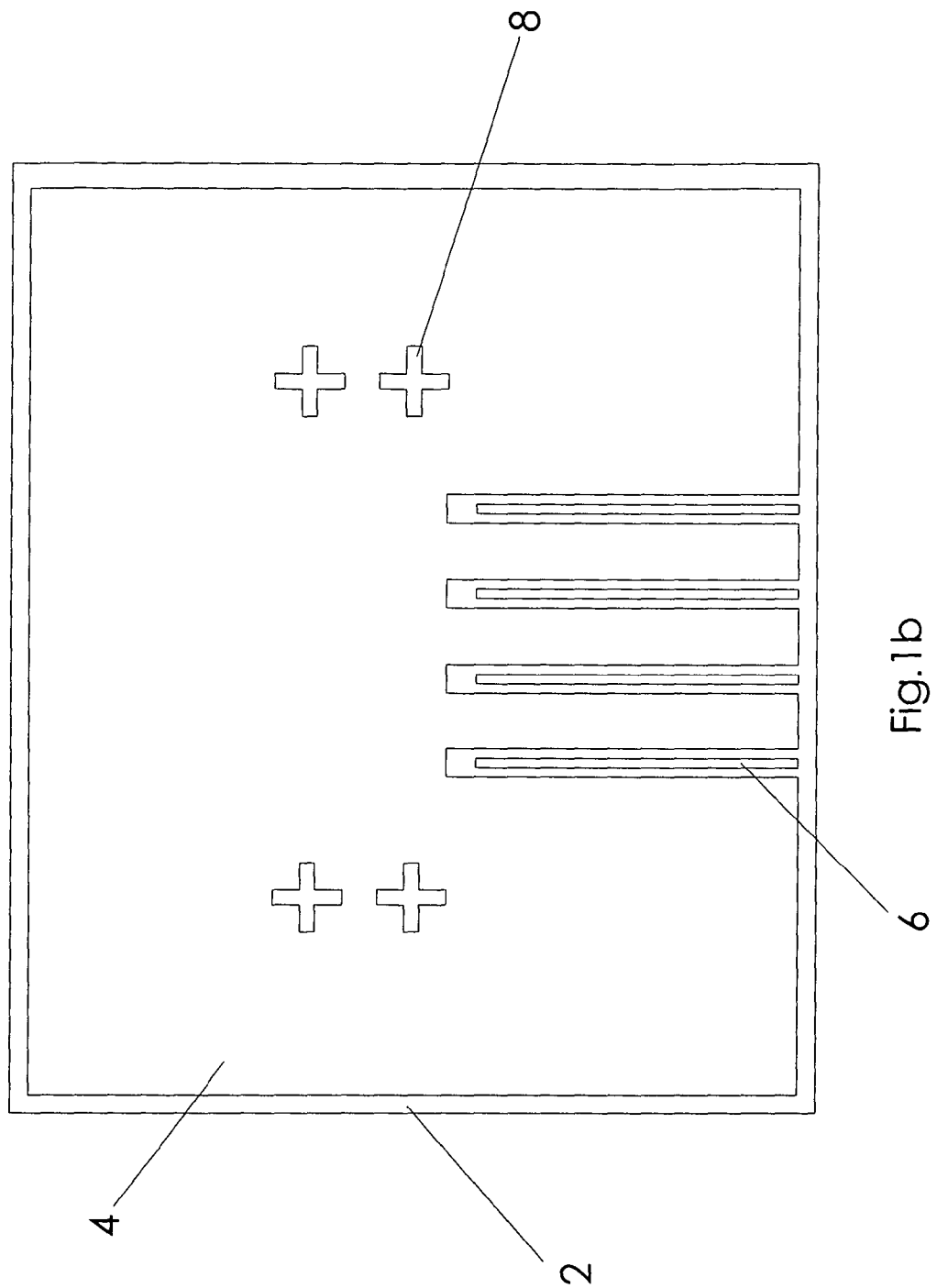

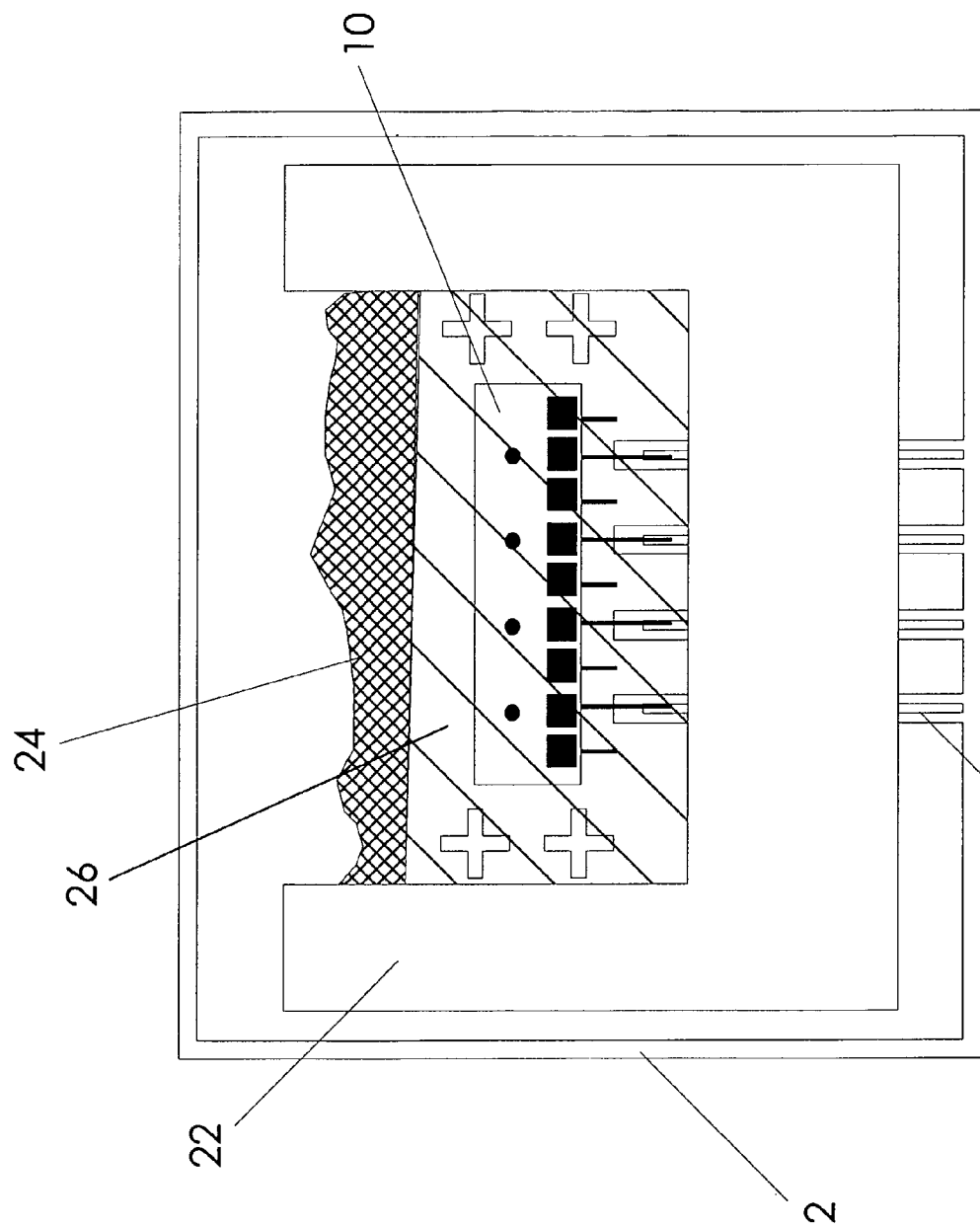

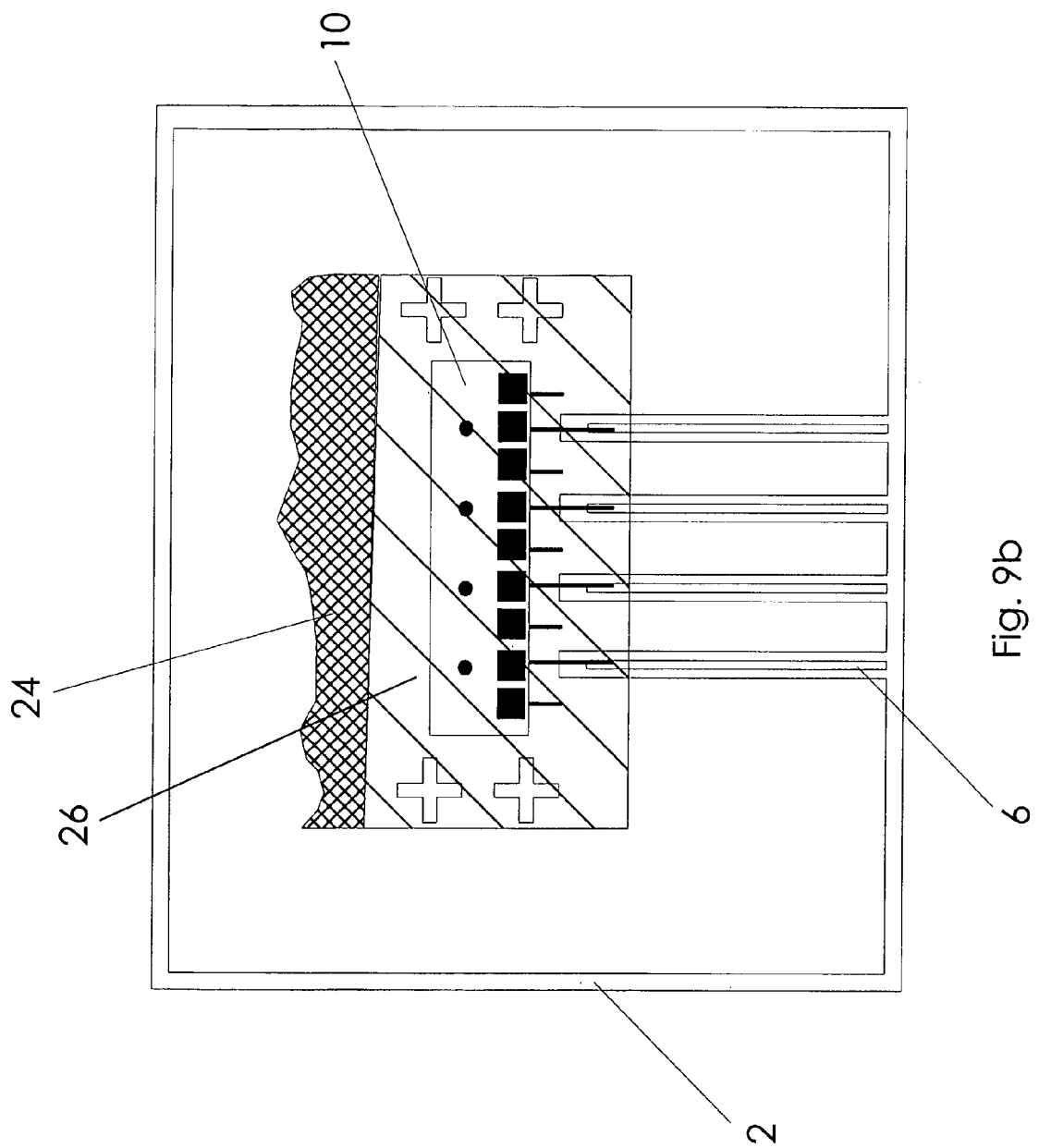

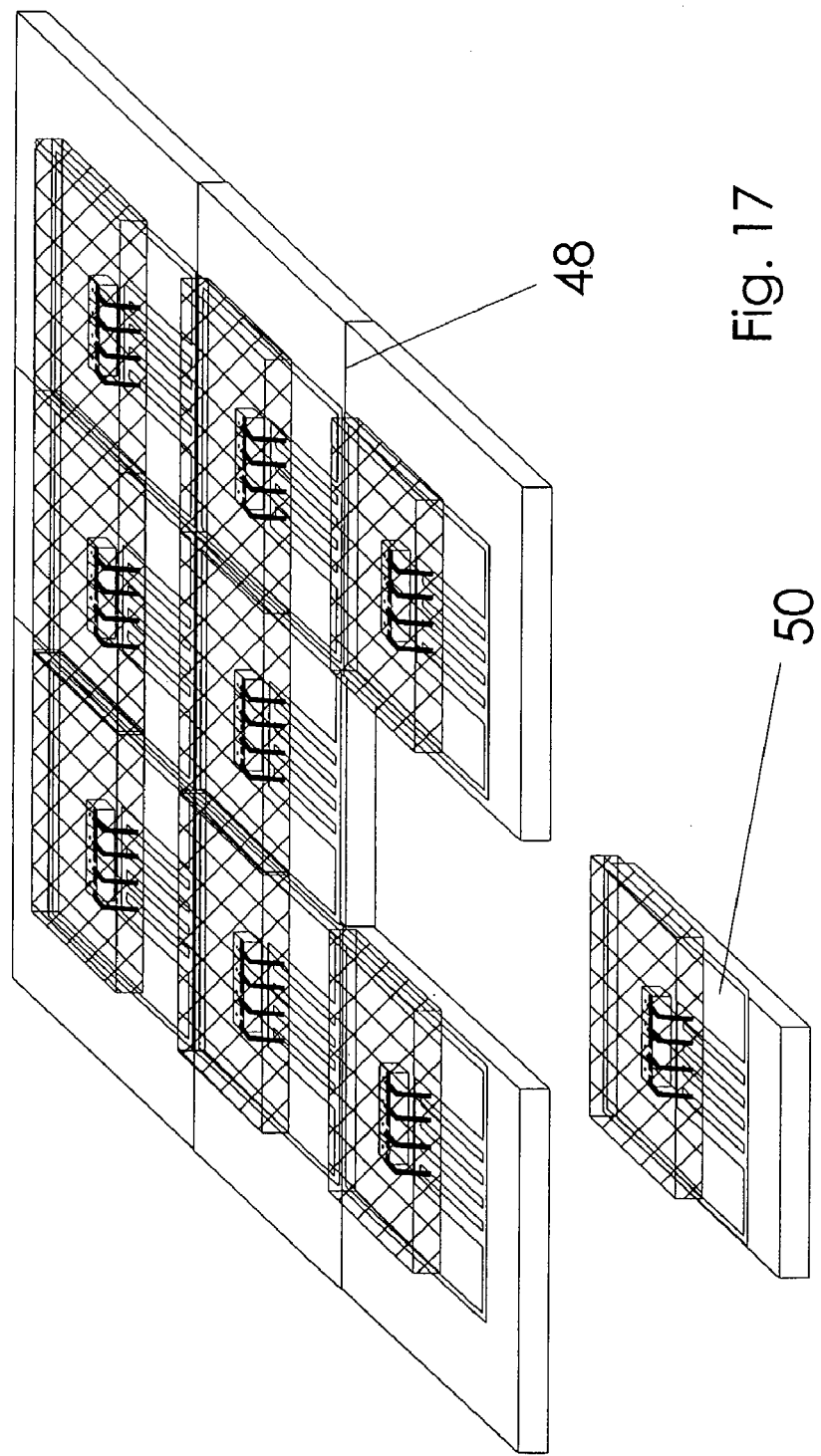

ENCAPSULATED OPTICAL PACKAGE

CROSS-REFERENCE TO RELATED APPLICATIONS

This application is a late entry into National Phase, and claims priority from, PCT application serial no. CA 04/001408, filed on Jul. 24, 2004, which claims priority from U.S. application Ser. No. 10/625,906 filed on Jul. 24, 2003, and from U.S. application Ser. No. 10/725,566 filed on Dec. 3, 2003 specifications of which are hereby incorporated by reference.

TECHNICAL FIELD

This invention relates to the field of optical packages. More precisely, this invention pertains to the field of packaging and coupling an optoelectronic chip, namely the encapsulation of optoelectronic devices and the provision for creating an optically flat and transparent window above the active region(s) of the optoelectronic device.

BACKGROUND OF THE INVENTION

Optoelectronic systems are increasing in their application to electronic equipment. High performance computers and computer network components increasingly involve conversion of computer data signals to photonic signals for transmission from one device to another, while such photonic signals require conversion to electronic data signals for use in the recipient electronic device.

Coupling optoelectronic components to waveguides remains an awkward aspect of manufacturing optoelectronic systems. Optoelectronic components are manufactured as small as possible, and therefore coupling requires precision alignment of components to waveguides. At the same time, waveguides such as optical fibers are very fragile and require secure encapsulation for mechanical stability and endurance. It is also difficult to achieve such requirements while keeping the resulting volume of a coupling as small as possible, a parameter that can be very important, if not essential, in many applications.

The encapsulation of microelectronic chips is very well known in the art and is commonly used to protect microchips in all varieties of chip packages. The method commonly used is to use a plastic resin and drop a glob of the resin over the wirebonded microchip within its package. U.S. Pat. No. 4,819,041 granted Apr. 4, 1989 and U.S. Pat. No. 5,313,365 granted May 17, 1994 both are good examples of methods used to encapsulate microchips within specific packages. These methods use types of plastic resins to fill a cavity where the microchip has been placed with (typically) opaque resin and without any consideration for the surface profile of the resin. Other examples in the prior art describe transparent epoxies such as U.S. Pat. No. 6,075,911 granted Jun. 13, 2000 and U.S. Pat. No. 6,269,209 granted Jul. 31, 2001 are examples of transparent epoxy or silicon are used with optoelectronic device and optical fibers. These patents describe how the two elements are aligned and then subsequent to the alignment how the epoxy or silicon is injected between the optoelectronic device and the optical fiber to increase coupling and provide protection.

There are several prior-art references that are still patent pending that describe encapsulation of optoelectronics. US patent application Pub. No. US 2002/0001869 dated Jan. 3, 2002 describes an encapsulation technique that uses a sacrificial layer over the encapsulated optoelectronic and includes methods for placing lenses over the open window, but does not describe a polishing method to reduce the thickness of the encapsulation, nor is alignment an issue. US patent application Pub. No. US 2002/0020803 dated Feb. 21, 2002 describes a method of encapsulating an entire photodetector and support electronics in an over-molded type transparent resin that includes an embedded lens that allows for light to pass through the resin to the optoelectronic device. This prior-art also does not allow for 2-D alignment and does not include polishing to create the window. Finally, US patent application Pub. No. US 2002/0181899 dated Dec. 5, 2002 discusses a method for imprinting a flat, but angled surface, on a transparent epoxy resin that encapsulated an optoelectronic device. The alignment method requires dowel pin alignment and is not amenable to polishing or 2-D alignment.

SUMMARY OF THE INVENTION

It is an object of the invention to provide a method for providing an encapsulated optoelectronic device.

According to a general aspect of the present invention, there is provided an assembly that can be treated the same way as other packaged microchips (for example: the placement of packaged chips on printed circuit boards) by encapsulating the optoelectronic device to form a complete package. However, the main reason for the requirement of a flat, transparent window over the optoelectronic device package is to provide the possibility for coupling other optical devices (such as optical fibers) to the optoelectronic device. The flat, transparent window facilitates the alignment procedure used between the optoelectronic device package and a second assembly (fiber optic ferrule, lens array, laser, etc.). The second assembly can be placed on the flat surface and aligned to the optoelectronic with a maximum of 3-degrees of movement required (2-lateral and 1-rotational). This methodology is known as stackable (or 2-D) optics, and greatly simplifies the alignment procedure. A specific example of this alignment strategy involves a vertical cavity surface emitting laser (VCSEL) array chip with an array of linear parallel optical fibers. Once the VCSEL array chip has been encapsulated in a transparent resin, it has a window (or flat, transparent surface) created above the array of Lasers on the VCSEL chip. The surface is essentially co-planar with the surface of the VCSEL chip. The distance between the surface of the VCSEL chip and the flat, transparent surface is kept to a minimum, without exposing the VCSEL chip, so that a maximum amount of coupling into optical fibers is possible.

This arrangement offers several other beneficial aspects as well. The encapsulated optoelectronic device is hermetically sealed so that no moisture or contaminants can develop over the device. It is also more resilient to vibration, especially if wirebonding is used to connect to the optoelectronic device. The transparent resin can also reduce the divergence of the light emitted from the optoelectronic device (assuming a high index of refraction epoxy is used for the desired wavelength of light) and thereby allow for a longer physical distance for the same optical distance that the light can travel.

According to another aspect of the invention, there is provided a method for manufacturing an encapsulated optoelectronic package comprising an optoelectronic chip, comprising providing a substrate, securing an optoelectronic chip on the substrate, providing a translucent coating substance over the optoelectronic chip, and polishing the translucent coating substance to create planar surface over at least the optoelectronic chip, substantially parallel to the substrate, wherein the planar surface over the optoelectronic chip provides an optical coupling window.

According to yet another aspect, the invention allows multiple parts to be manufactured at the same time. This involves providing an array of patterned substrates on a larger substrate, securing multiple optoelectronic chips to the substrates, electrically connecting all chips to their respective traces on their respective patterned substrates, providing a translucent coating substance over all of the optoelectronic chips and surrounding area, using a rigid squeegee to screen-print a precise amount of the translucent coating substance with a flattened surface over the chips, then masking certain regions and curing the translucent coating substance over other regions to produce planar surfaces with an optical coupling window over each optoelectronic chip.

The invention therefore also provides a method for manufacturing an optoelectronic package comprising an optoelectronic chip, comprising: providing a substrate; securing an optoelectronic chip on said substrate; applying a translucent coating substance, over at least a portion of the optoelectronic chip to create a planar surface, over at least said optoelectronic chip, substantially parallel to said substrate; and allowing said coating substance to harden; wherein said planar surface provides an optical coupling window for said optoelectronic chip.

According to still another aspect of the invention, there is provided an optoelectronic package comprising: a substrate; an optoelectronic chip mounted on said substrate; a translucent coating substance forming a planar surface, over at least a portion of said optoelectronic chip, substantially parallel to said substrate; and wherein said planar surface provides an optical coupling window for said optoelectronic chip.

BRIEF DESCRIPTION OF THE DRAWINGS

Further features and advantages of the present invention will become apparent from the following detailed description, taken in combination with the appended drawings, in which:

FIG. 17 is a 3D perspective view of the 3×3 array having been divided into 9 individual encapsulated packages.

It will be noted that throughout the appended drawings, like features are identified by like reference numerals.

DETAILED DESCRIPTION OF THE PREFERRED EMBODIMENT

The encapsulated optical package provides a simple method of producing an optical quality flat window over the active region of an optoelectronic device. The optical window is created perpendicularly to the direction of light emission/detection of the optoelectronic device.

In the case of an array of surface-emitting lasers, such as vertical cavity surface emitting laser (VCSEL) array chip, the window is created over the chip and is co-planar with the chip.

The optical window allows a method of alignment that eliminates several undesirable degrees of mechanical freedom. The flat, co-planar window restricts alignment to 2 lateral movements and one rotational movement (X, Y and $\theta_Z$). Typically, there are 6 degrees of mechanical movement (X, Y, Z, $\theta_X$, $\theta_Y$, $\theta_Z$).

Electrical trace lines that extend from the encapsulated optoelectronic device to an external electrical connection, such as bond-fingers or a press-fit connector, provide the electrical access to the optoelectronic device.

In some embodiments, the optoelectronic device is first bonded onto the substrate using an electrically and thermally conductive epoxy. The exact placement of the optoelectronic chip with respect to the substrate can be done with low positional accuracy. It is one aspect of this invention that allows the subsequent alignment of optical fibers, lenses, or other optical components to the packaged optoelectronic device to be the critical alignment step for both the lateral and rotational position. Once optical fibers, lenses, or other optical components are aligned and fixed over the packaged optoelectronic device, the far-end of the optical fibers, lenses, or other optical components becomes the optical reference surface and the electrical connections on the substrate must accommodate any positional error.

This packaging method also hermetically seals the optoelectronic chip so that it is not susceptible to humidity. Also, since the chip is encapsulated, its tolerance to mechanical vibration is greatly increased.

By encapsulating using a transparent material with a high refractive index, the divergence angle of the light-emitting device is decreased, allowing for a better coupling efficiency.

First Preferred Embodiment

Polished Transparent Epoxy

Figure 1A:
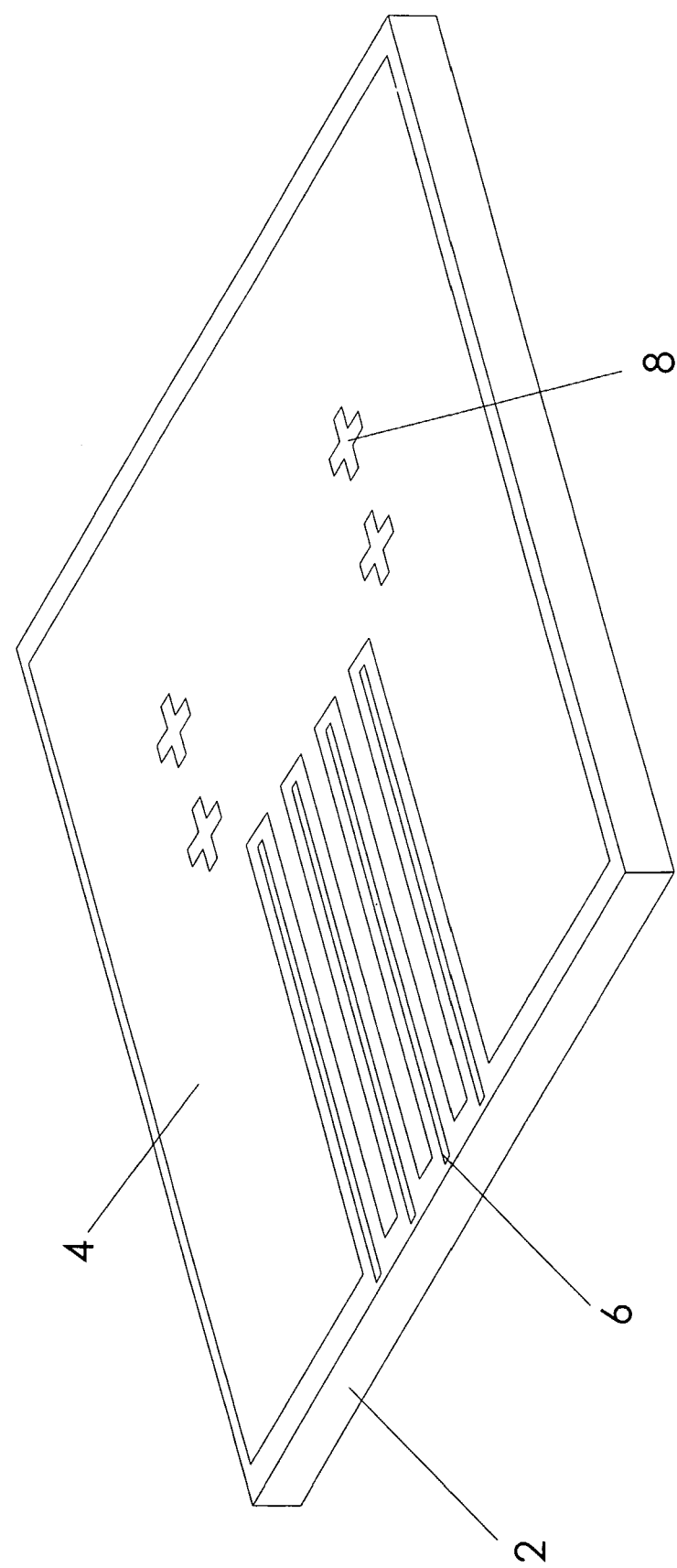
FIGS. 1a,b are a 3D perspective view and a top view of a substrate; the substrate comprises conductive trace lines and a location for receiving an optoelectronic chip.
Figure 1C:
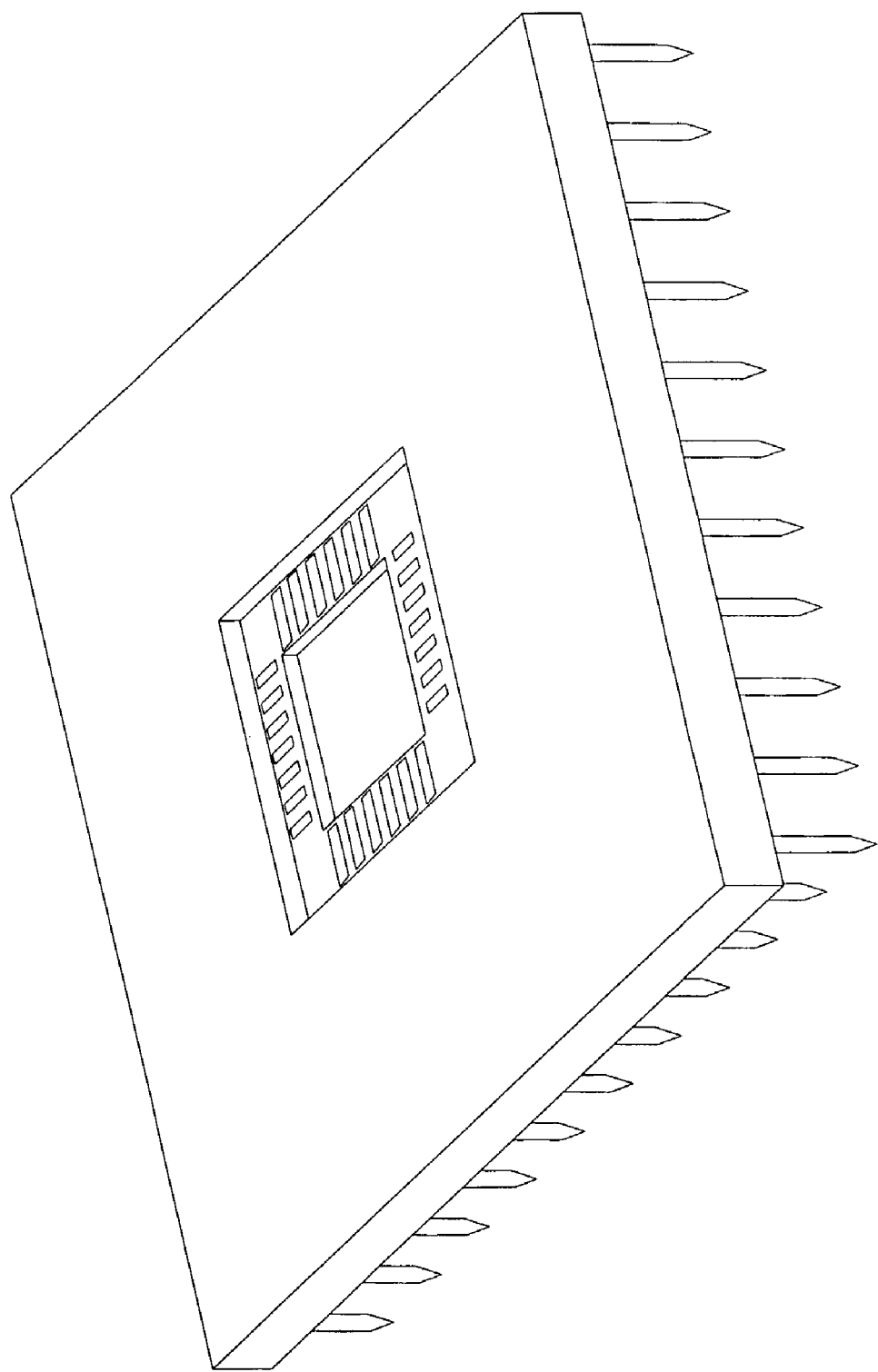
FIG. 1c is a 3D perspective view of a standard Ceramic-Pin Grid Array (C-PGA) carrier with an optoelectronic device and transparent epoxy deposited in the open cavity.
Figure 1D:
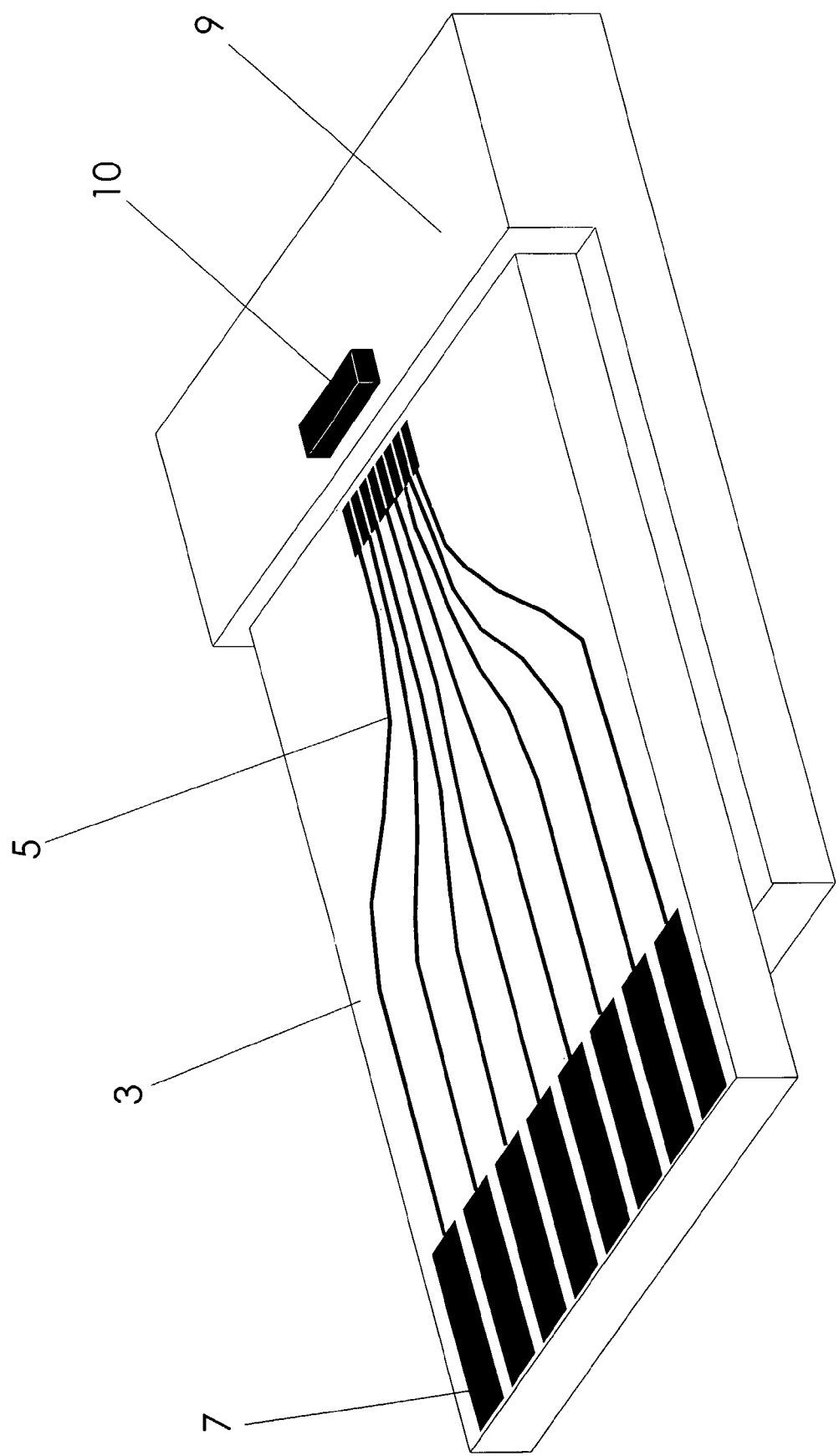
FIG. 1d is a 3D perspective view of a custom carrier with the optoelectronic device on a separate block and a printed circuit board adjacent to the optoelectronic device.

As shown in FIGS. 1a and 1b, the substrate (2) is the mechanical support for the assembly. It carries all of the elements and is used to electrically access the optoelectronic chip. There are many possible configurations for the chip carrier. The first is to use off-the-shelf pin grid array (PGA) chip carriers that have an inner cavity where the optoelectronic is placed and outer connection pins which are plugged into the PCB as shown in FIG. 1c. Transparent epoxy would be placed in the inner cavity over the optoelectronic chip and then polished flat. A second version, as shown in FIGS. 1a and 1b is a more custom approach and could be based on patterning gold on an alumina substrate. A thin gold layer can typically be deposited on a flat aluminum oxide wafer or chip onto which the optoelectronic can be glued and wirebonded. As implied in the preferred embodiment, the external electrical connections to this custom-made chip carrier would allow, preferably, a second set of wirebonds from the substrate to an external PCB to take up the slack for any initial misalignment of the optoelectronic device with respect to the substrate. A third version is another custom approach that uses PCB technology and a small form connector to create the chip carrier as shown in FIG. 1d. The PCB (3) consists of trace lines (5) and a card-edge or similar electrical connection (7). The optoelectronic is placed on a metallic heat sink (9) over which the PCB is placed and bonded. The primary gain of this type of carrier is its adaptable geometry and its heat-sinking capabilities. The steps described below involving transparent epoxy and polishing could all be equally applied to any of these mentioned arrangements of chip packages.

In the following embodiment, the chip carrier will be based on the second version, as shown in FIGS. 1a,b, described above based on the gold patterned alumina substrate. The Encapsulated Optical Package consists of 5 elements. The elements are described as a substrate (or carrier package), transparent epoxy, electrically conductive epoxy, wirebonds, and an optoelectronic chip.

Figure 2A:
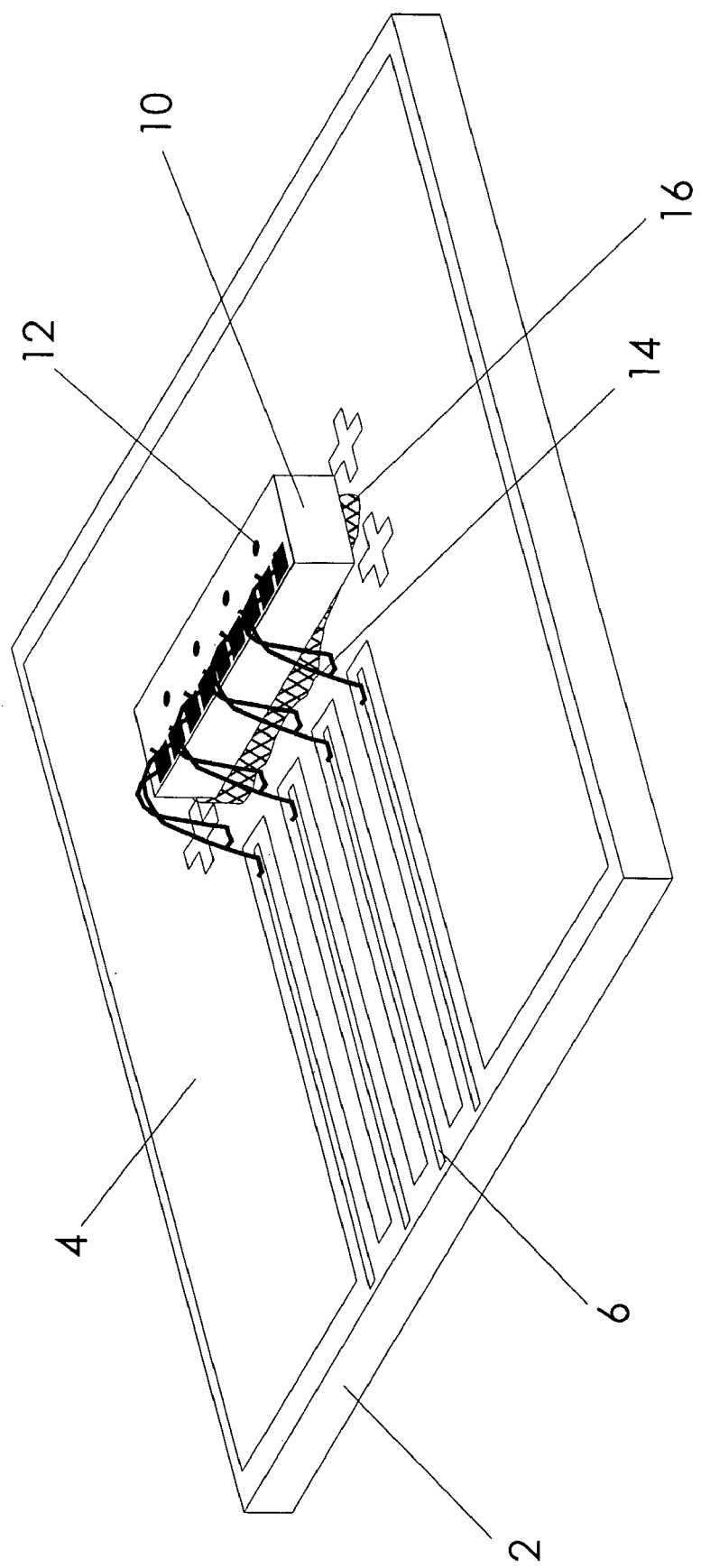
FIGS. 2a,b are a 3D perspective view and a top view of a substrate where an optoelectronic chip has been secured using electrically conductive epoxy.
Figure 2B:
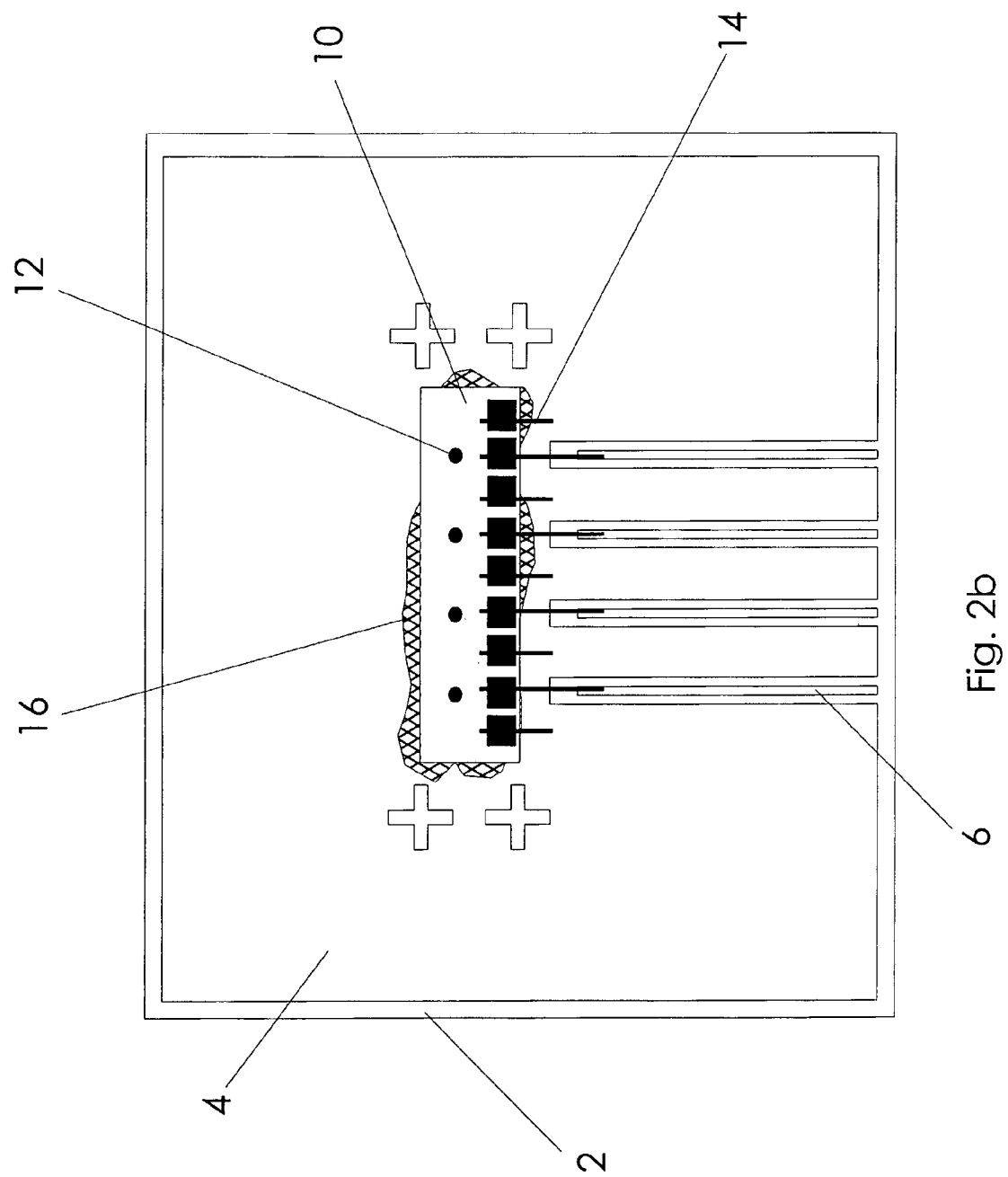

The custom-made alumina substrate is on the order of 1.5-cm×1.5-cm×0.2-cm in size. The top of the alumina substrate is patterned with a set of parallel gold trace lines (6) that start near the center of the substrate and end near one side of the substrate. The rest of the substrate, outside the trace lines is patterned with a continuous layer of gold (4) with alignment marks (8) for the placement of the optoelectronic chip. Preferably, the gold thickness and quality is amenable to wedge or ball wirebonding. The trace lines are used to transmit electrical signals from the perimeter of the substrate to the middle of the substrate where the chip will be placed as shown in FIGS. 2a,b.

The optoelectronic chip (10) is placed near the middle of the substrate on a portion of the gold layer, within a reasonable distance for wirebonding from the tips of the trace lines. The emitting device, such as a vertical cavity laser (12), or a detecting device, such as a photodetector, is oriented so that its direction of operation is normal to the substrate for vertical coupling of the light, although side-launched optoelectronic device may also be contemplated. The exact placement of the chip is not critical, as long as the chip can be properly wirebonded to the trace lines. The chip is epoxied in place using electrically conductive epoxy (16) and is then wirebonded to the trace lines. Preferably, the wirebonds (14) are made as flat as possible so that their peaks are no more than 30-40-microns above the surface of the chip. Since the chip is higher than the trace lines, low wirebonds will be possible. For simplicity, and for when the chip has a common cathode, or anode, on its backside, the trace lines for the common, or ground, potential may be connected directly to the area below the chip as shown in FIGS. 2a,b.

A transparent epoxy is then used that will harden using time, heat, or UV-light with a sufficiently high hardness factor so that it can be polished. Preferably, the epoxy has sufficient viscosity before being set so that it does not spread out over the surface too quickly. The following epoxies were found to be well suited to this application: Dymax (model: OP-4-20632), Dexter (model: Hysol CNB753-42) and Eques (model: UV Laquer 1322 000 40045). These epoxies do not limit this application but only serve as examples of epoxies that have shown good properties in terms of wavelength, hardness, durability and moisture resistance.

Figure 3A:
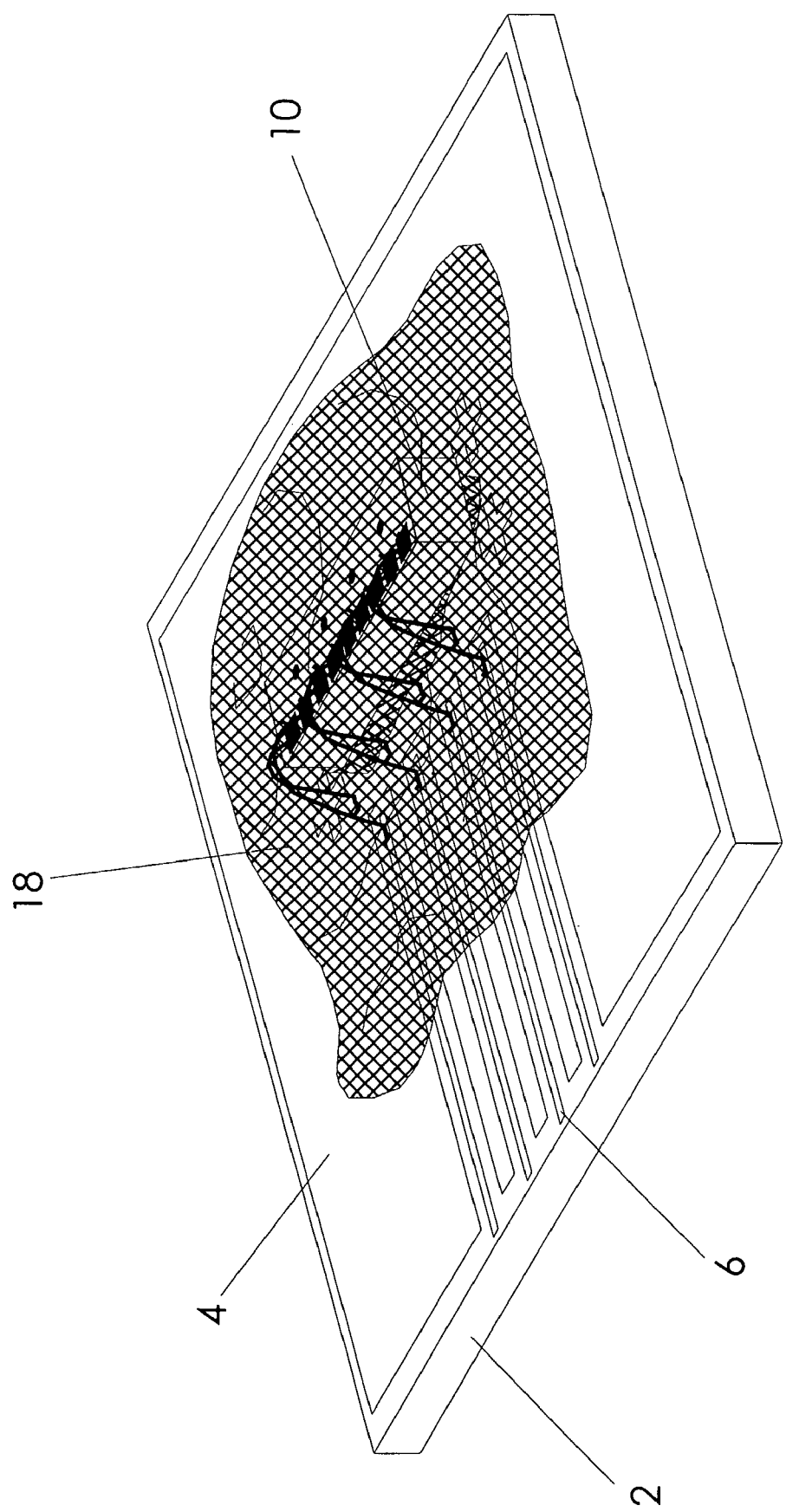
FIGS. 3a,b are a 3D perspective view and a top view of a substrate where a bump of transparent epoxy has been placed over the secured optoelectronic chip.
Figure 3B:
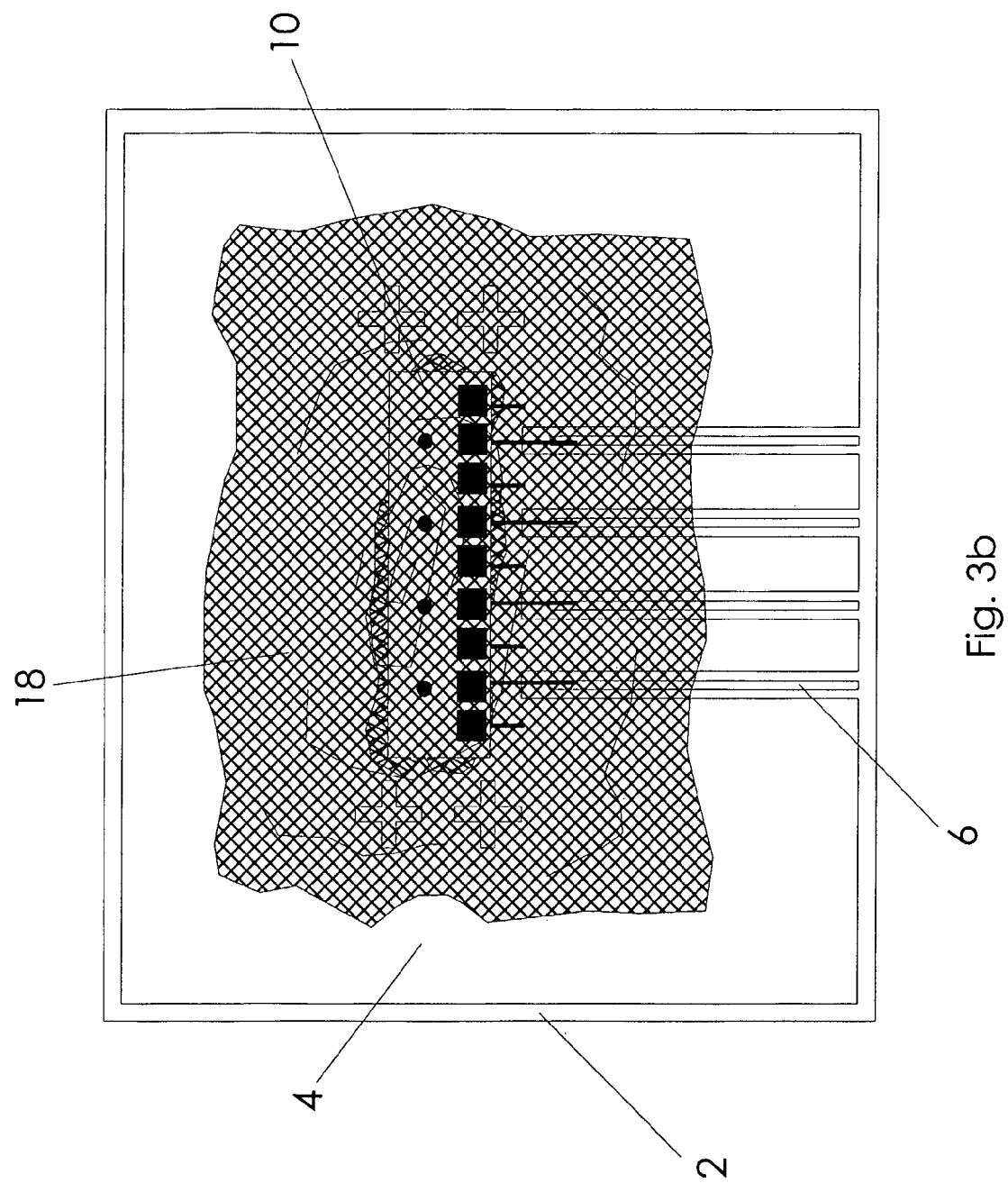

The epoxy is deposited carefully over the optoelectronic chip, so not to damage the wirebonds. Preferably, the epoxy forms a somewhat convex bump (18) over the optoelectronic chip that completely encapsulates both the chip and the wirebonds, as shown in FIGS. 3a,b. Preferably, the epoxy does not cover the distant ends of the trace lines so that the chip can still be accessed electrically.

Figure 4A:
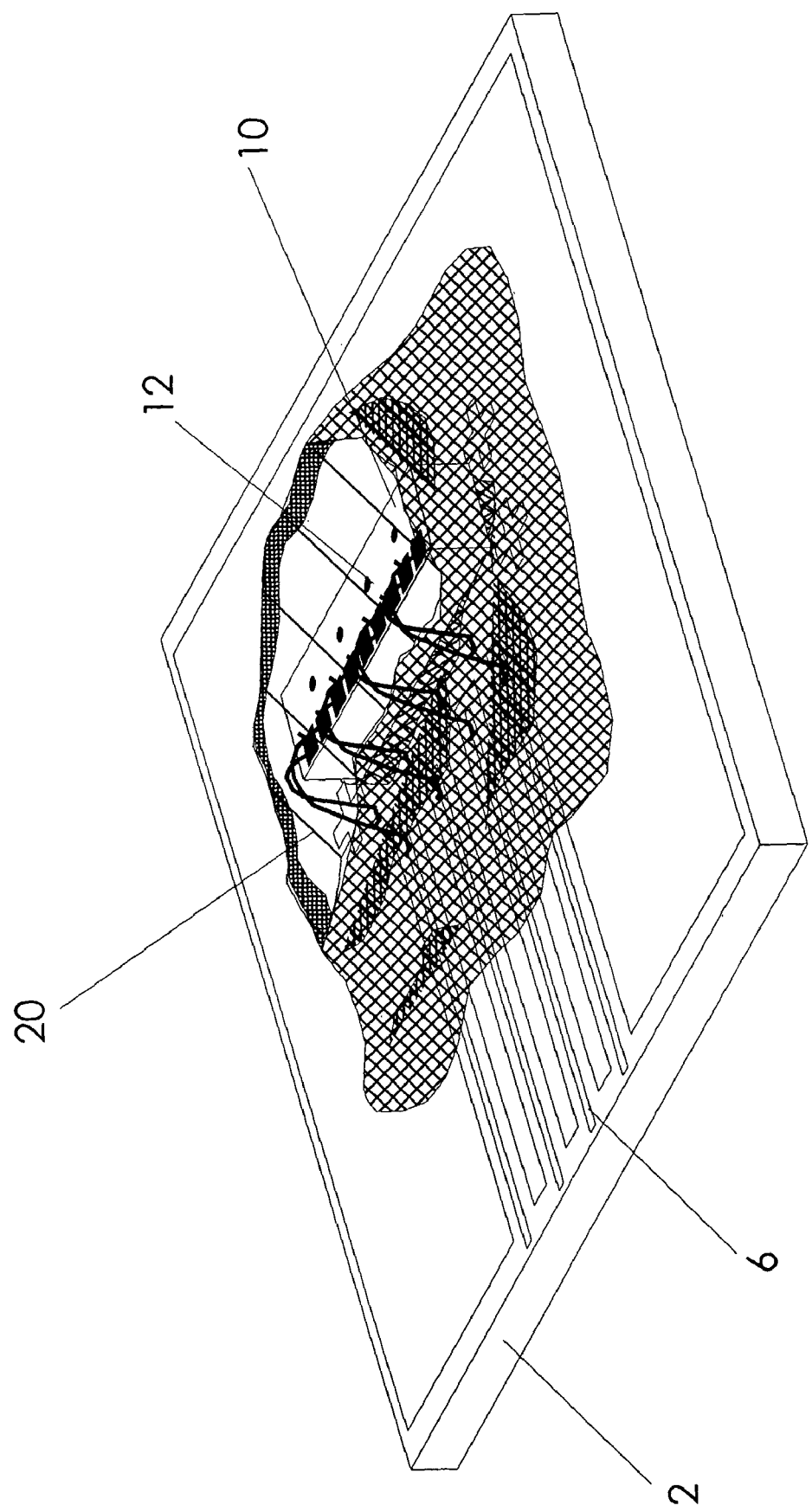
FIGS. 4a,b are a 3D perspective view and a top view of a substrate with a secured optoelectronic chip where the bump of epoxy has been polished over said optoelectronic chip.
Figure 4B:
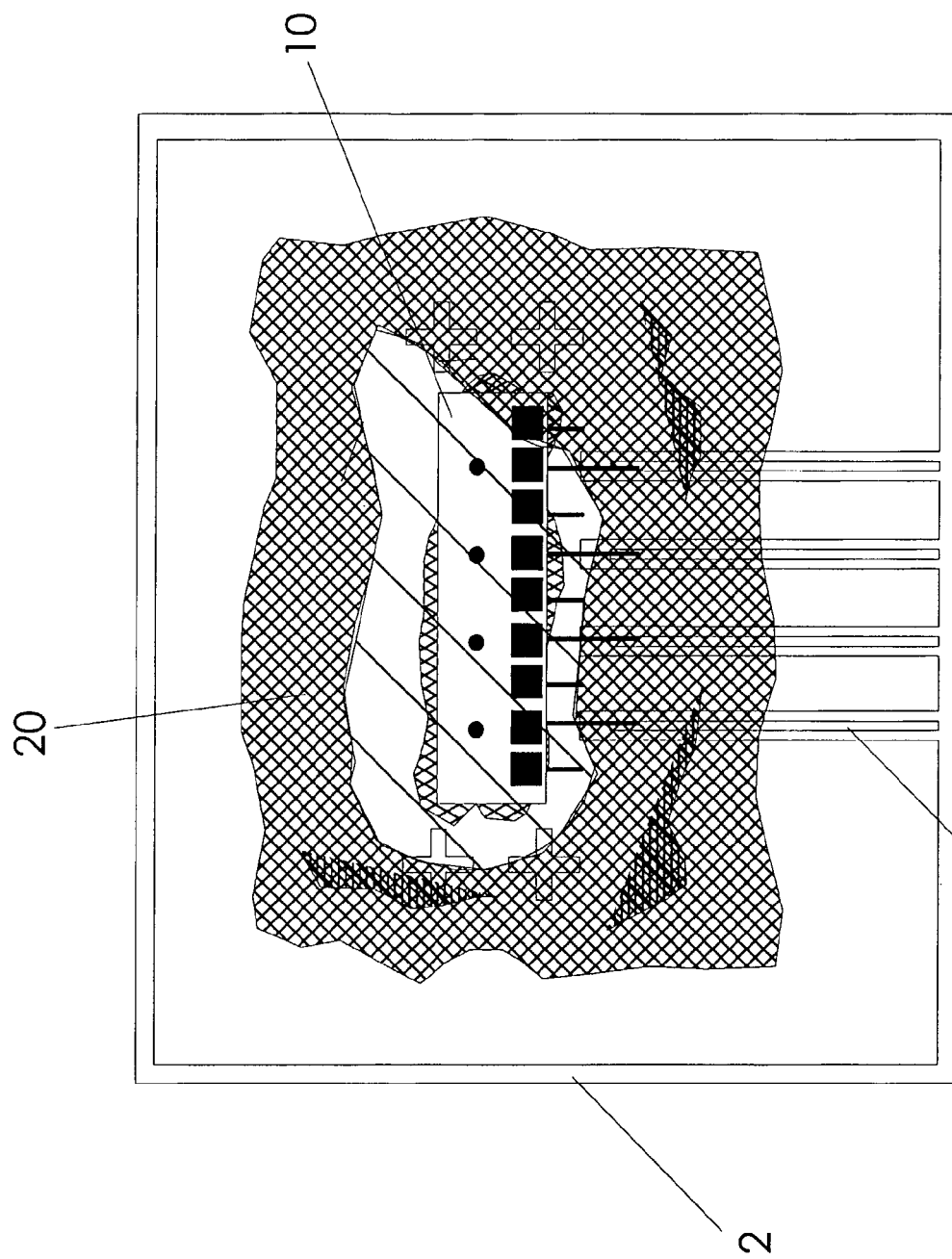

The whole package is then placed on a polishing machine so that the bump of epoxy faces the polishing paper. Preferably, standard lapping and polishing techniques are applied, including progressively finer grits of polishing paper, correct timing, appropriate slurry mixtures, and a method of holding the parts in a rigid manner. Preferably, the polishing is stopped before the wirebonds or optoelectronic chip are damaged and an optically flat window (20), that is co-planar with the surface of the optoelectronic device and chip substrate is formed. A thin, transparent layer of epoxy will remain over the chip as shown in FIGS. 4a,b.

Figure 5:
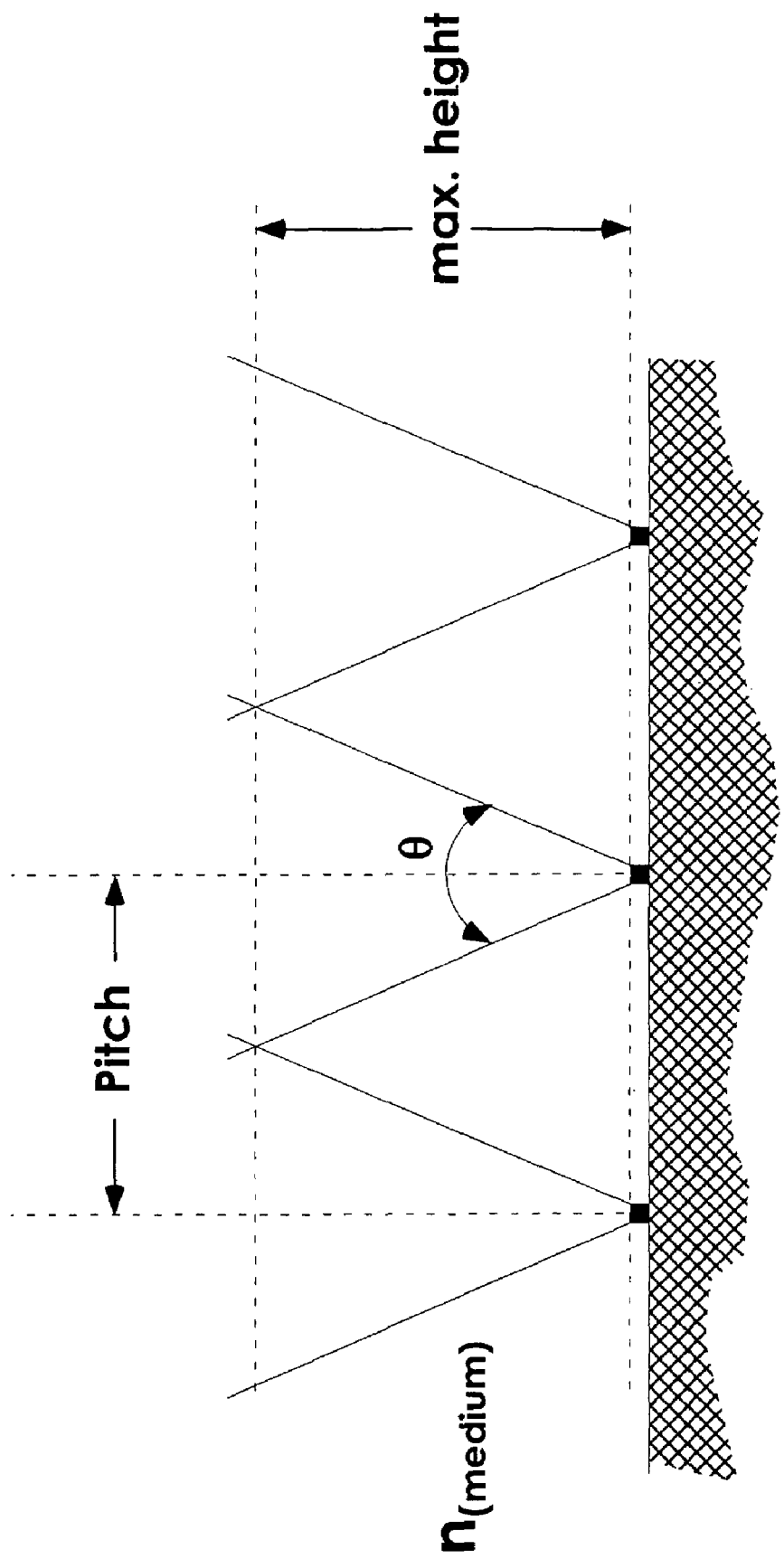
FIG. 5 is a diagram which shows a geometric determination of maximum polish height.

The maximum distance above an optoelectronic chip before optical crosstalk would occur can be calculated, as shown in FIG. 5. For a light emitter such as a VCSEL, the epoxy index of refraction "$n_e$", the pitch of the light emitting devices on the optoelectronic chip "p", and the open-air full divergence angle "θ" in radians of the light source determines the maximum usable height of the epoxy above the chip:

Max. height=$(p/2)*(1/\tan((\theta/2)/n_e)$

For example, if p=250-microns, θ=28-degrees=0.4887-rad, and $n_e$=1.5, max. height is equal to 760.5-microns. However, distances as low as 50-microns are also desirable to couple the maximum amount of light into optical fiber.

Alternative Embodiment

Polished Transparent Epoxy with Removable Protection Plate

To aid in the process of polishing the transparent epoxy and/or to aid in containing the epoxy within a more confined volume on the substrate (2) around the chip (10), an intervening step can be performed.

Figure 6A:
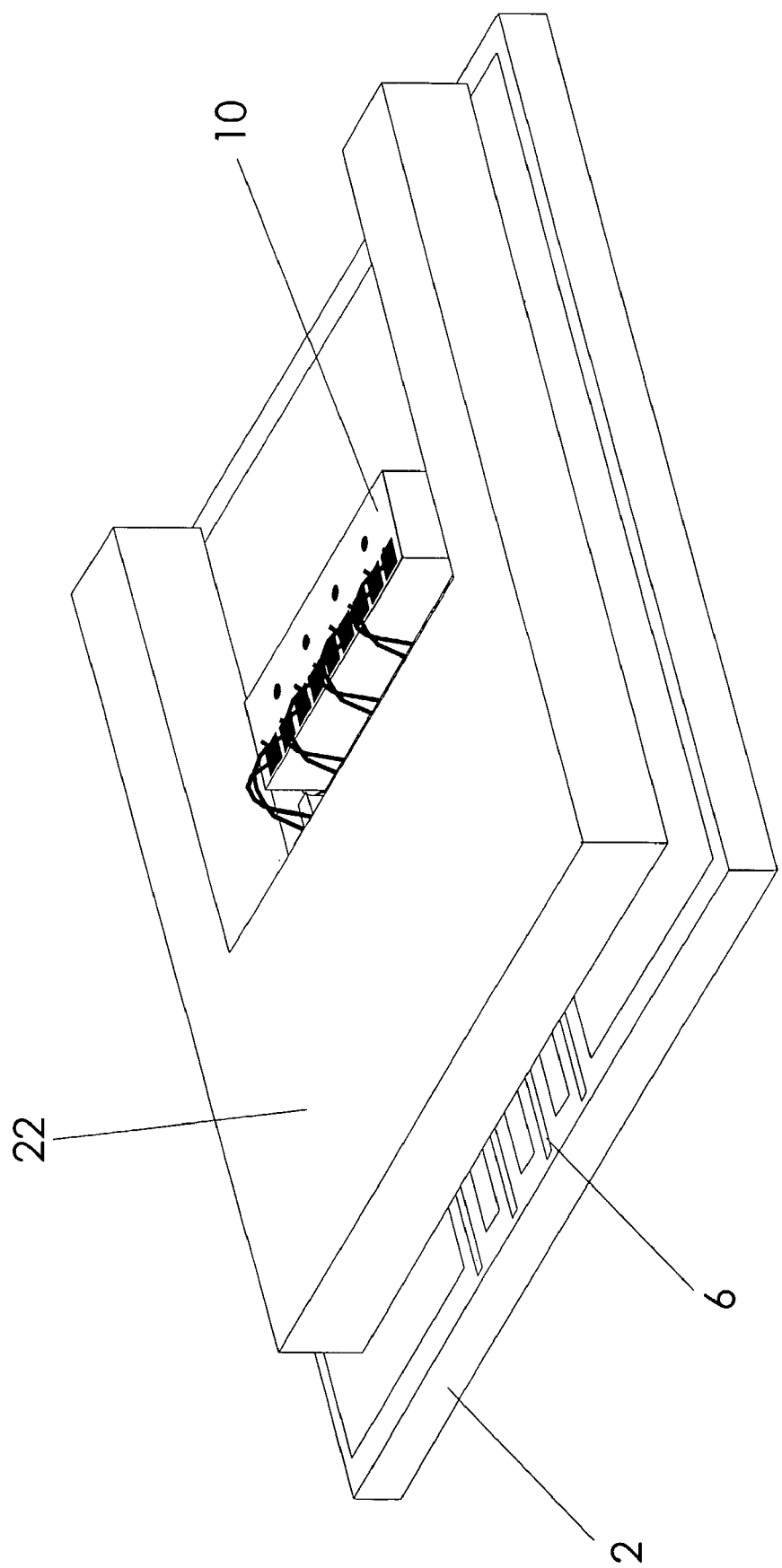
FIGS. 6a,b a 3D perspective view and a top view of a substrate with a secured optoelectronic chip where a protection plate surrounding the optoelectronic chip has been placed.
Figure 6B:
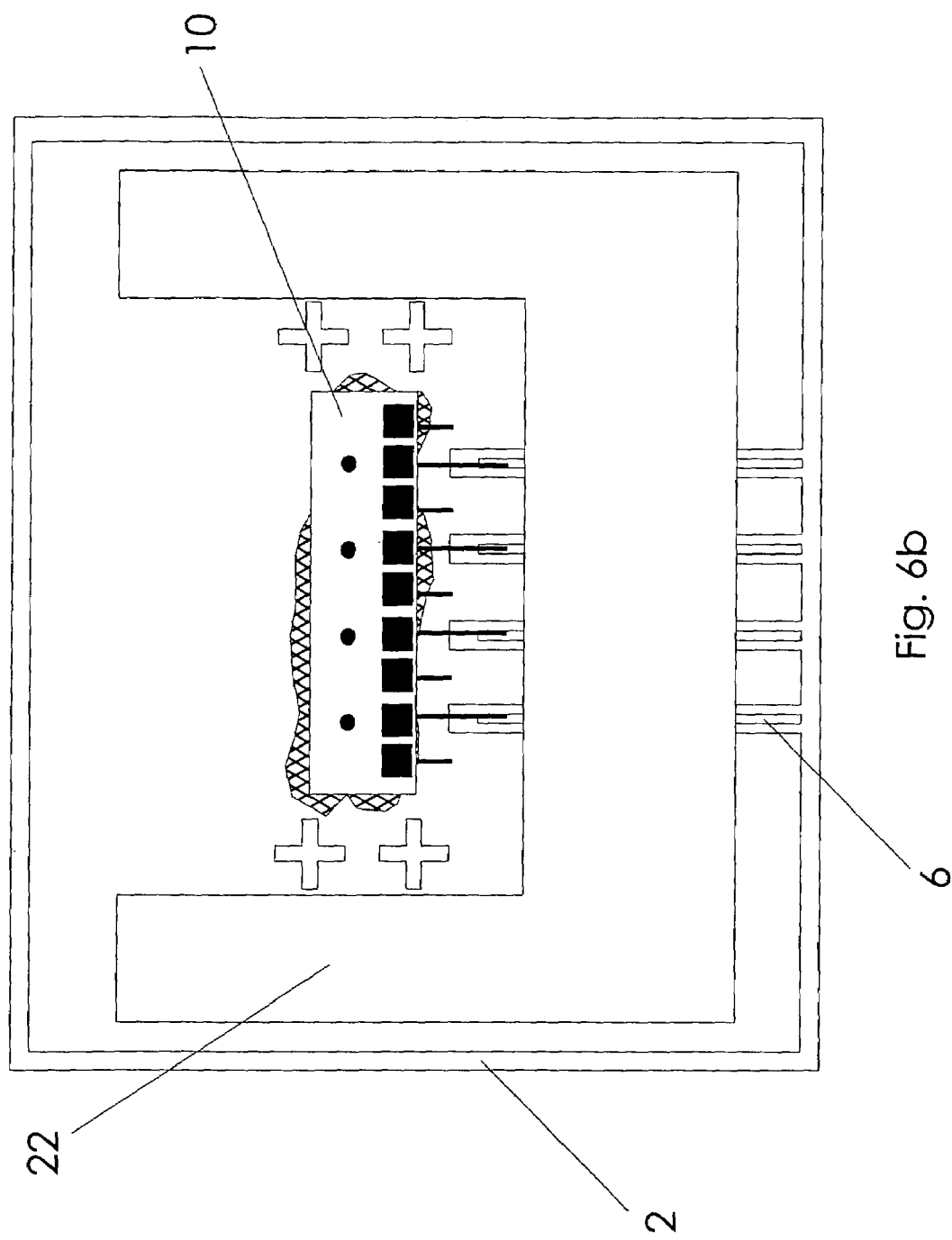

The chip carrier, the chip, and the wirebonds are identical to the first preferred embodiment. However, before the transparent epoxy is placed over the chip, a frame or protection plate can be introduced. The protection plate (22) would typically have a hole or notch such that when it was placed on the chip carrier, it would surround the optoelectronic chip and the wirebonds. As shown in FIGS. 6a,b, the protection plate could be made of various materials (glass, plastic, etc.) and would offer protection to the optoelectronic chip during the polishing procedure.

The thickness of the protection plate could be chosen to be slightly higher that the optoelectronic chip and wirebonds, and be of a material that would polish less quickly than the transparent epoxy. This would help ensure that the optoelectronic chip was not damaged. Depending on the protection plate material, and the method of depositing the epoxy, the plate could be either removed, in some manner, or left in place. Preferably, the plate is also non-conductive or at least insulated from the trace lines on the substrate, and allows access to the distant ends of the trace lines for electrical access to the optoelectronic chip.

Figure 7A:
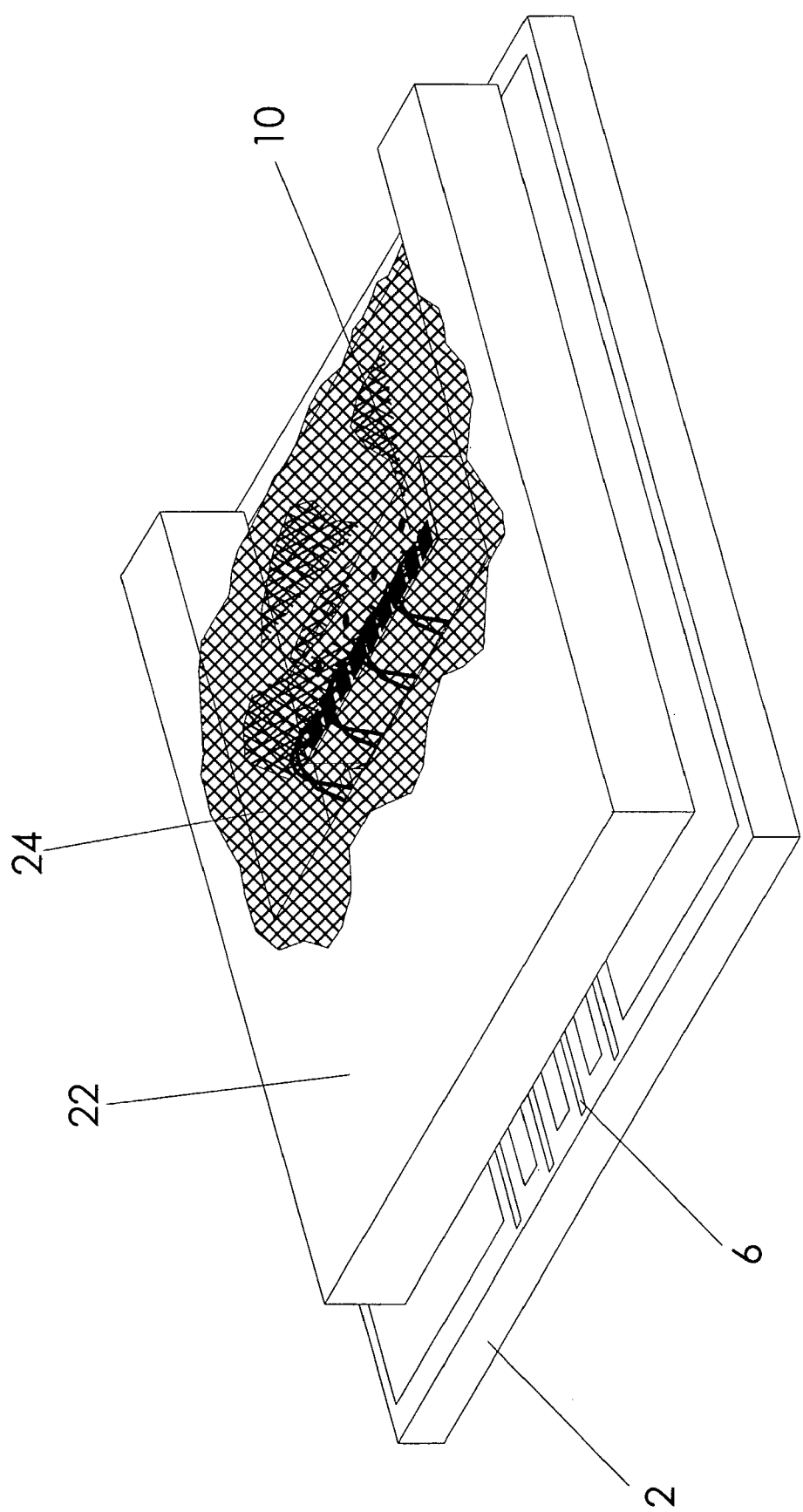
FIGS. 7a,b are a 3D perspective view and a top view of a substrate with a secured optoelectronic chip where the protection plate surrounding the optoelectronic chip has been placed together with epoxy.
Figure 7B:
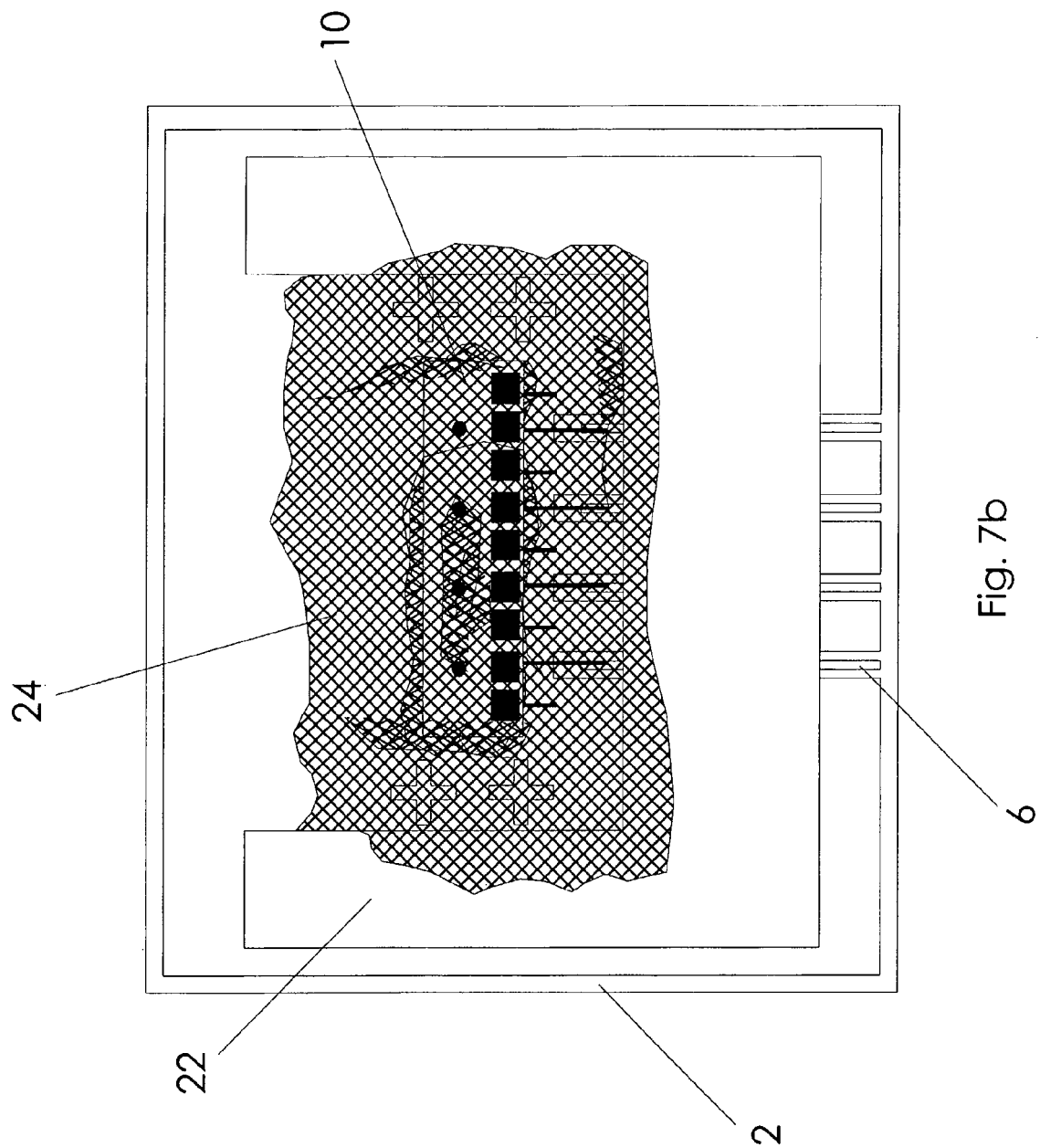

The transparent epoxy is then injected into the open hole, or notch, over the optoelectronic chip provided by the protection plate. Enough epoxy (24) is used to completely encapsulate the chip and form a rounded surface of epoxy that is higher than the protection plate as shown in FIGS. 7a,b. The epoxy is then time, heat or UV cured.

Figure 8A:
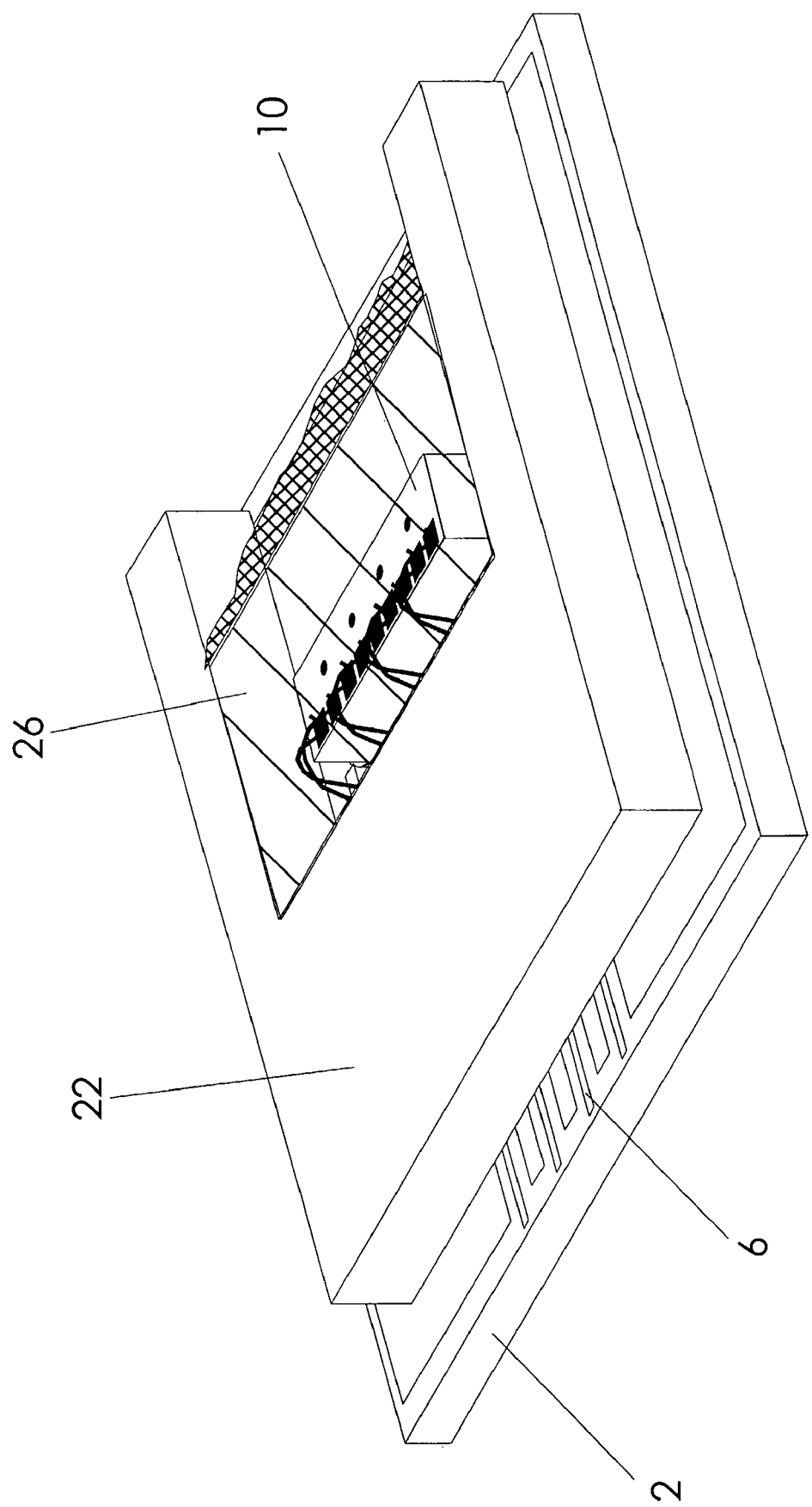
FIGS. 8a,b are a 3D perspective view and a top view of a substrate with a secured optoelectronic chip where the protection plate surrounding the optoelectronic chip has been placed together with polished epoxy.

The assembly is then placed up side down on a polishing machine so that the protection plate and the epoxy face the polishing surface. The epoxy is polished until it is level with the protection plate and an optically flat window (26), that is co-planar with the chip and the substrate, is formed over the optoelectronic chip. Preferably, standard lapping and polishing techniques are applied, including progressively finer grits of polishing paper, de-ionized water, correct timing, appropriate slurry mixtures, and a method of holding the parts in a rigid manner as shown in FIGS. 8a,b.

Figure 9A:
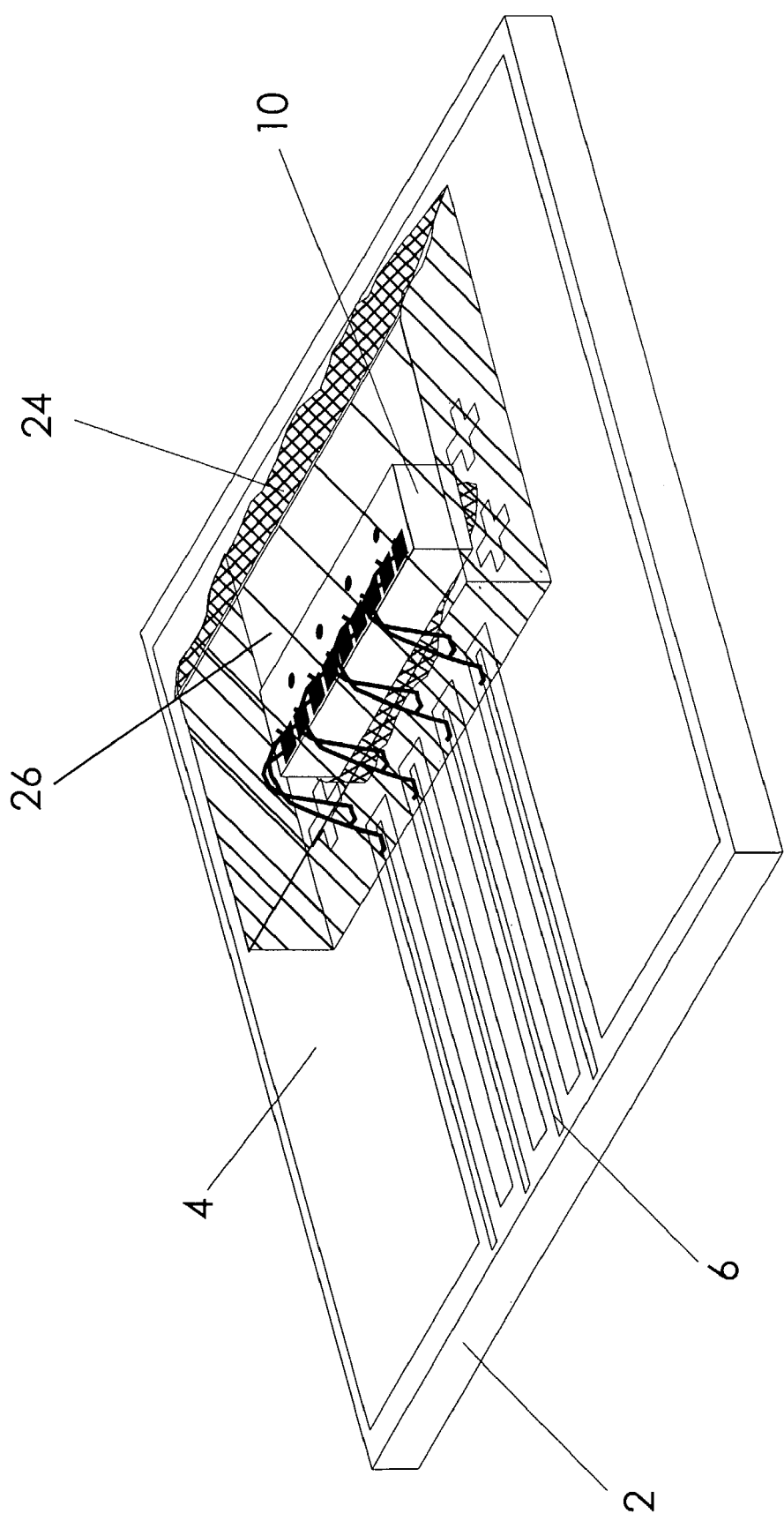
FIGS. 9a,b are a 3D perspective view and a top view of a substrate with a secured optoelectronic chip with an optional removal of the protection plate.

The resulting effect is shown in FIGS. 9a,b, when the protection plate is removed.

Assembly—Complete Encapsulation Methods:

Ultimately, the encapsulated optical package must be placed into a useful support structure that allows access to the optical input or output and the electrical input or output. This requires that the encapsulated optical package be itself packaged in a second tier package (such as a transceiver housing) that may involve further encapsulation for mechanical stability and to protecting the transparent epoxy from moisture absorption or other contaminates. A standard method for sealing transparent epoxies is proposed in U.S. Pat. No. 6,269,209 and U.S. Pat. No. 6,075,911, both use resin barriers over their transparent epoxies to eliminate moisture absorption.

Although these referenced US patents may serve to protect against moisture, in the above embodiments, the use of a sufficiently moisture resistant resin or epoxy is assumed. Such epoxies were outlined above.

However, further to this patent disclosure is a method that allows for moisture resistance, electromagnetic interference protection and mechanical stability over the encapsulated optical package.

Figure 10A:
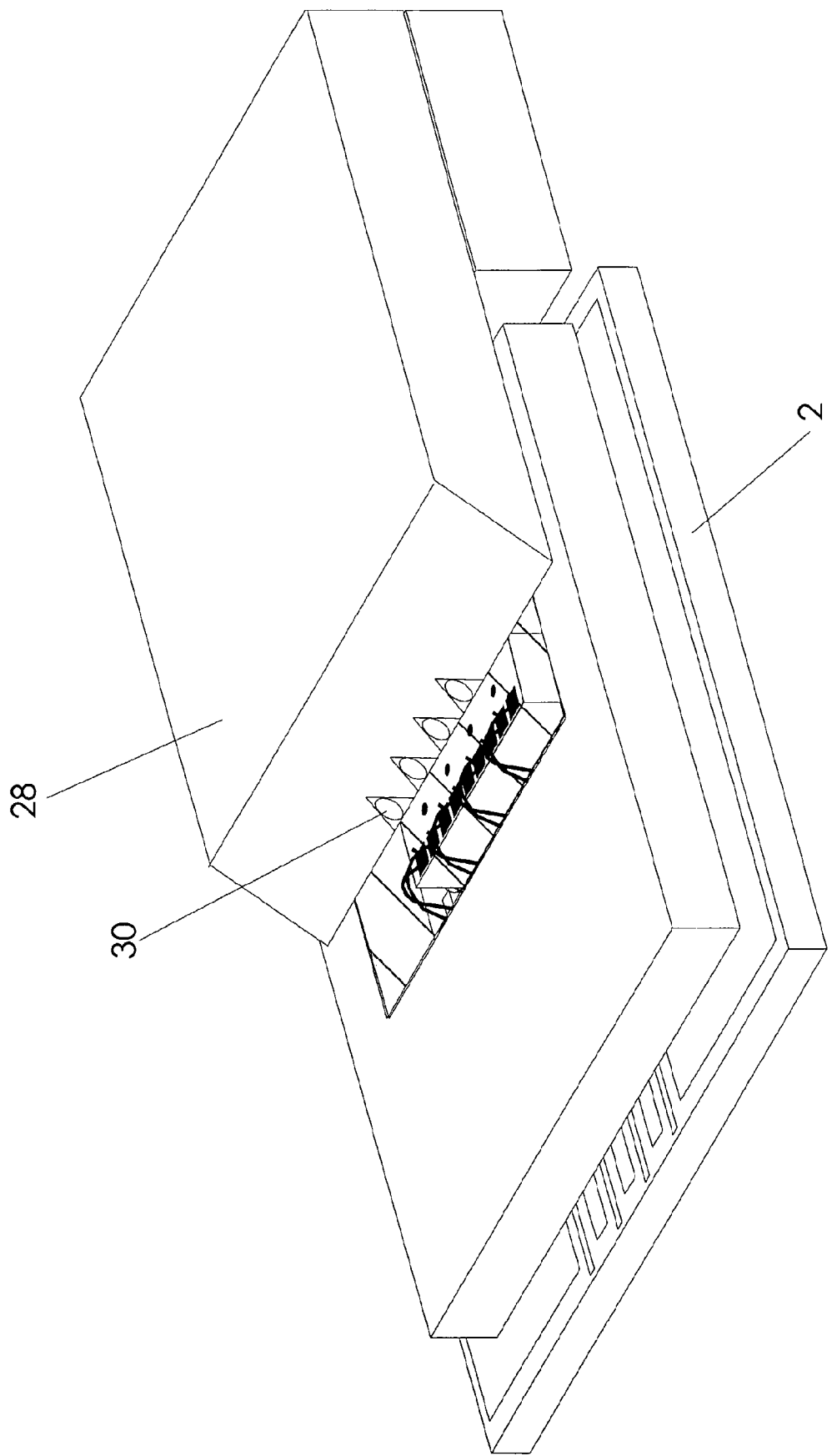
FIG. 10a is a 3D perspective view of a optical ferrule over the packaged optoelectronic chip.

As shown in FIG. 10a, an optical ferrule (28) has been placed over the encapsulated optical package of FIG. 8a.

Figure 10B:
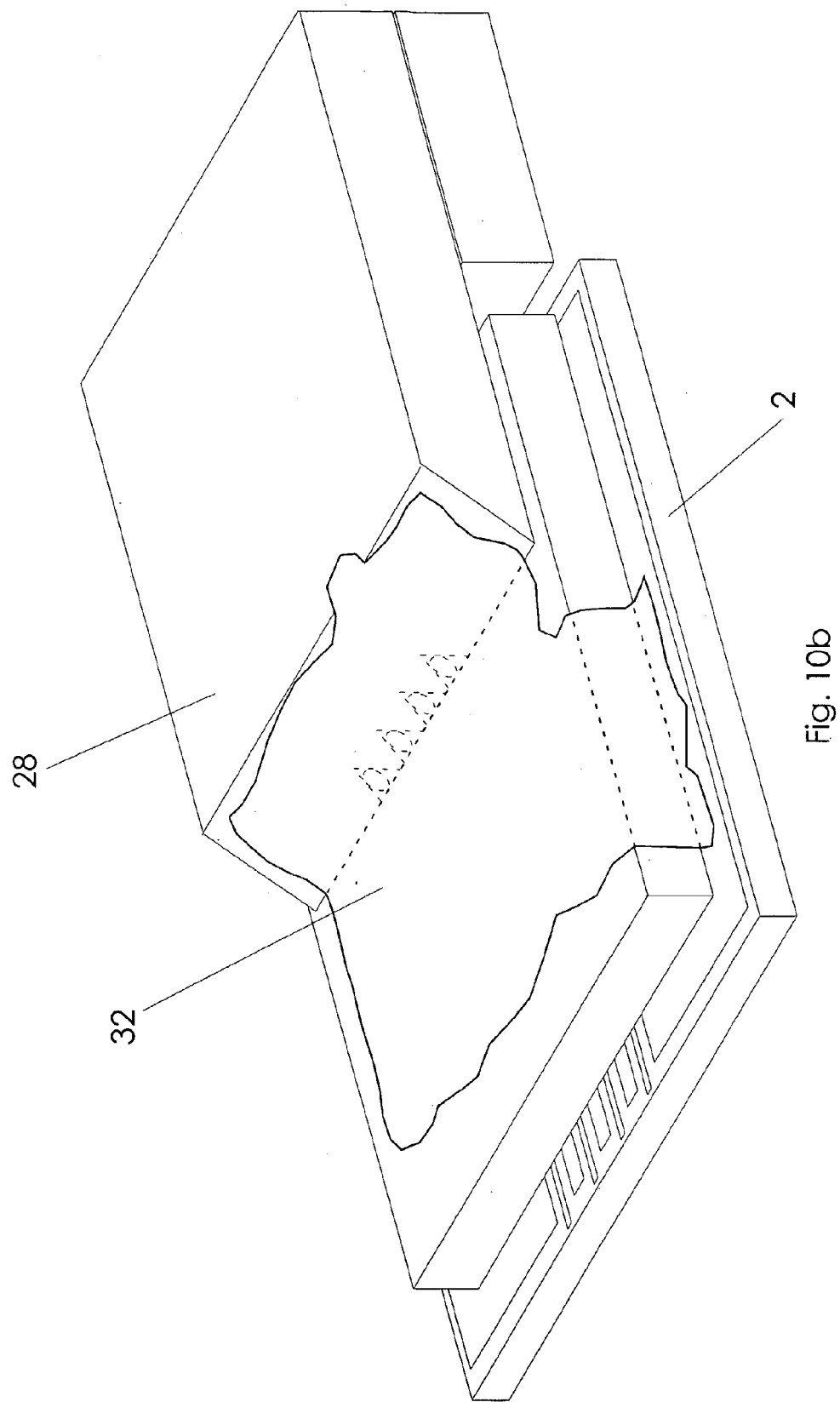
FIG. 10b is a 3D perspective view of a metallic layer coated over the optical ferrule and packaged optoelectronic chip.

As shown in FIG. 10b, the area over the transparent epoxy where the 45-degree beveled optical fibers (30) exist has been coated with a metallic layer (32), preferably by selective masking and gold evaporation techniques, so that: 1) the transparent epoxy is protected from moisture, 2) the optoelectronic is electromagnetically shielded when the shield is grounded, and 3) a metallic mirror is formed over the beveled optical fibers to aid in optical reflection into the optical fiber.

Figure 10C:
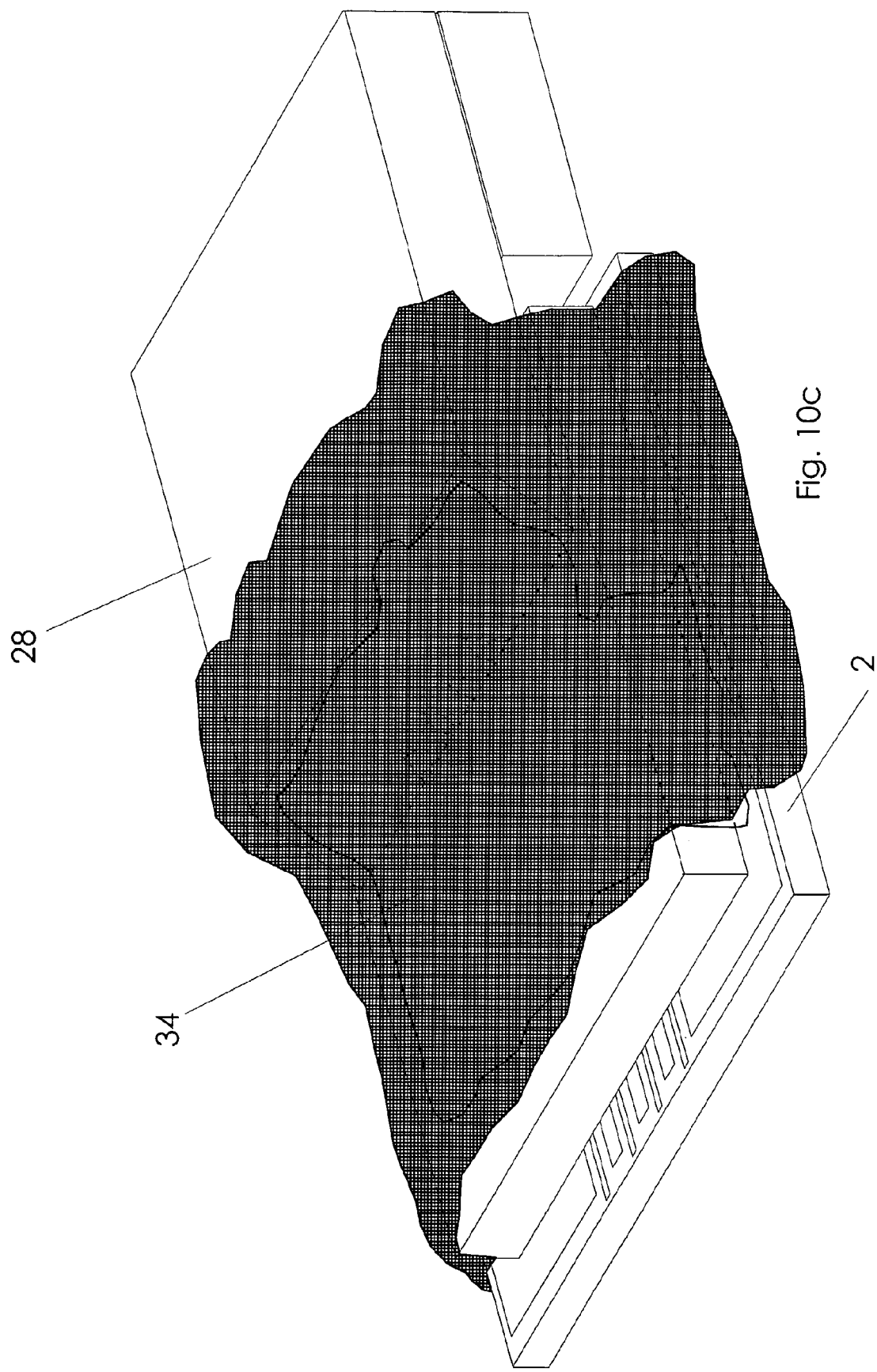
FIG. 10c is a 3D perspective view of a plastic protection resin (glob-top) over the metal coated optical ferrule and packaged optoelectronic chip.

Finally, the entire assembly is coated in a protective standard thermoplastic resin (34) to mechanically bond the parts within a larger assembly as shown in FIG. 10c.

Volume Manufacturability—Third Embodiment

Another embodiment of the desired encapsulated package that lends itself to volume manufacturability involves screen printing the optically transparent material over an array of optoelectronic chips.

Figure 11:
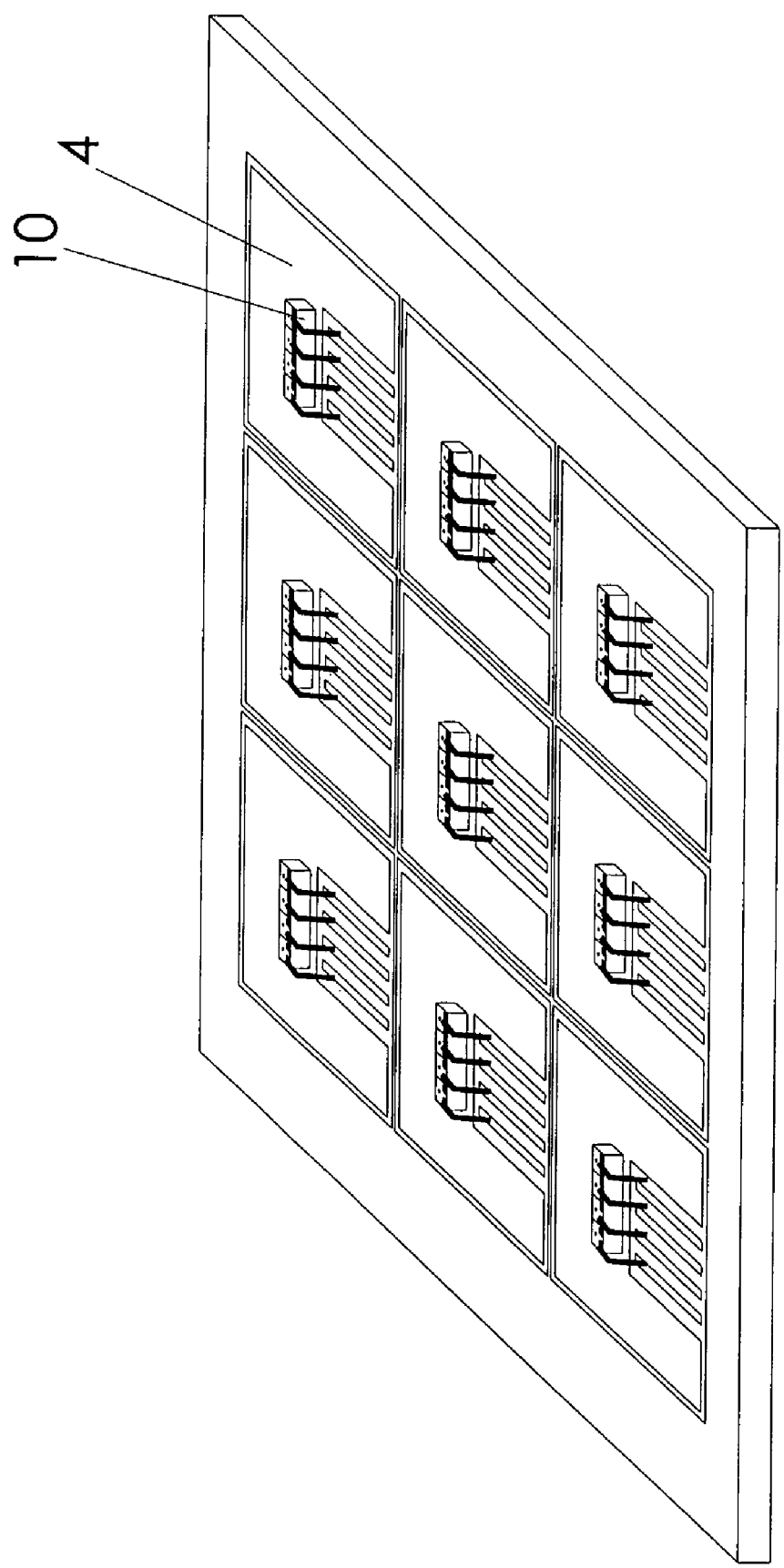
FIG. 11 is a 3D perspective view of an example 3×3 array of substrates where optoelectronic chips have been secured and wirebonded using electrically conductive epoxy and wirebonds, respectively.

The pattern for a single package as shown in FIG. 1a is essentially replicated several times in an array pattern on a larger substrate as shown in FIG. 11. An optoelectronic chip (10) is attached and wirebonded to the area just in front of the parallel gold trace lines (4).

Figure 12:
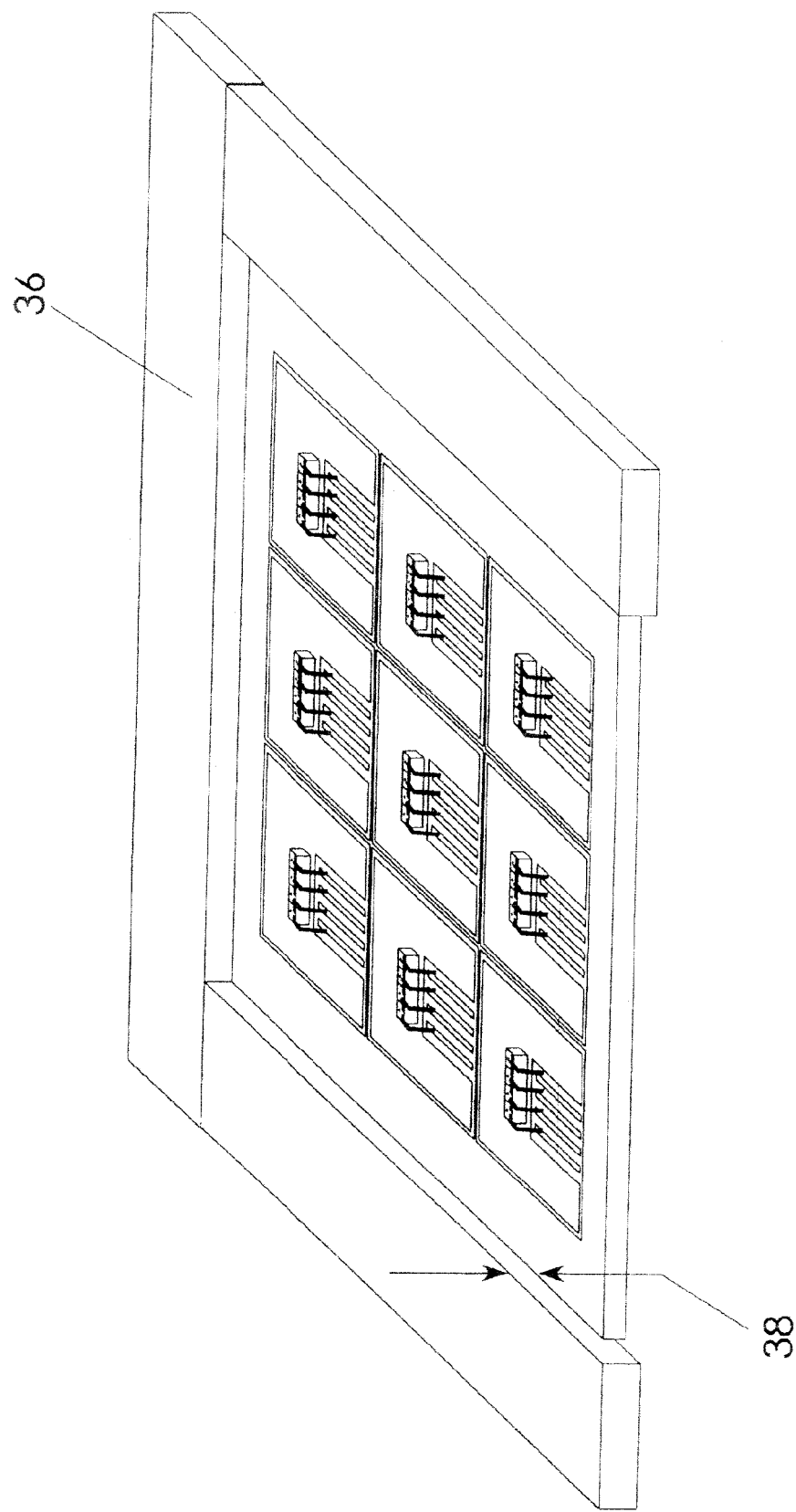
FIG. 12 is a 3D perspective view of the 3×3 array of substrates with a raised border surrounding.

The entire large substrate is then placed in an assembly rig (36) that has slightly higher borders (38) than the substrate and the optoelectronic chip as shown in FIG. 12. If the substrate is 1-mm thick and the optoelectronic chip is 0.15-mm thick, then the border (38) should be approximately 1.25-mm thick to allow for a 0.1-mm layer over the top of the chip including the allowance for the loop height of the wedge wirebond.

Figure 13:
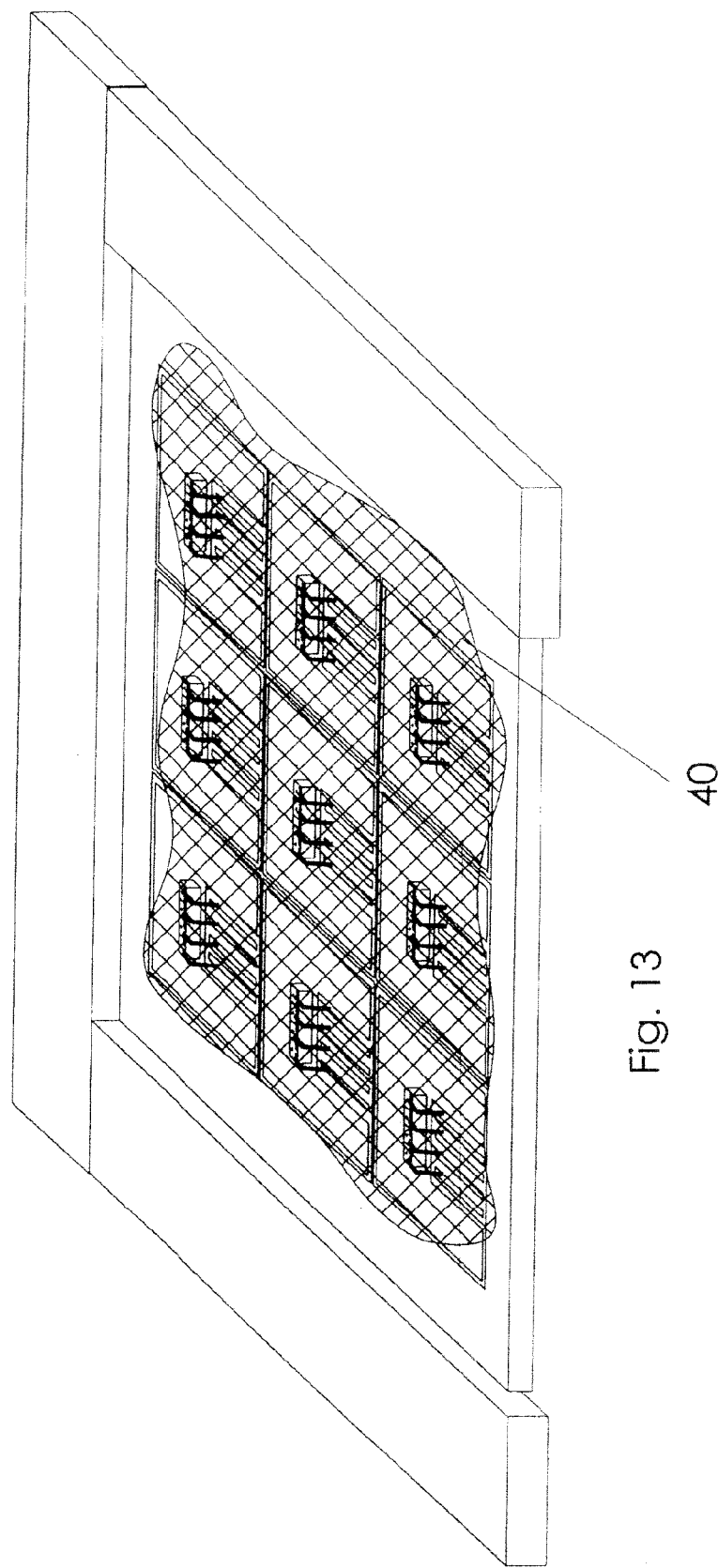
FIG. 13 is a 3D perspective view of the 3×3 array of substrates with an optically transparent encapsulating material deposited over the entire area.
Figure 14:
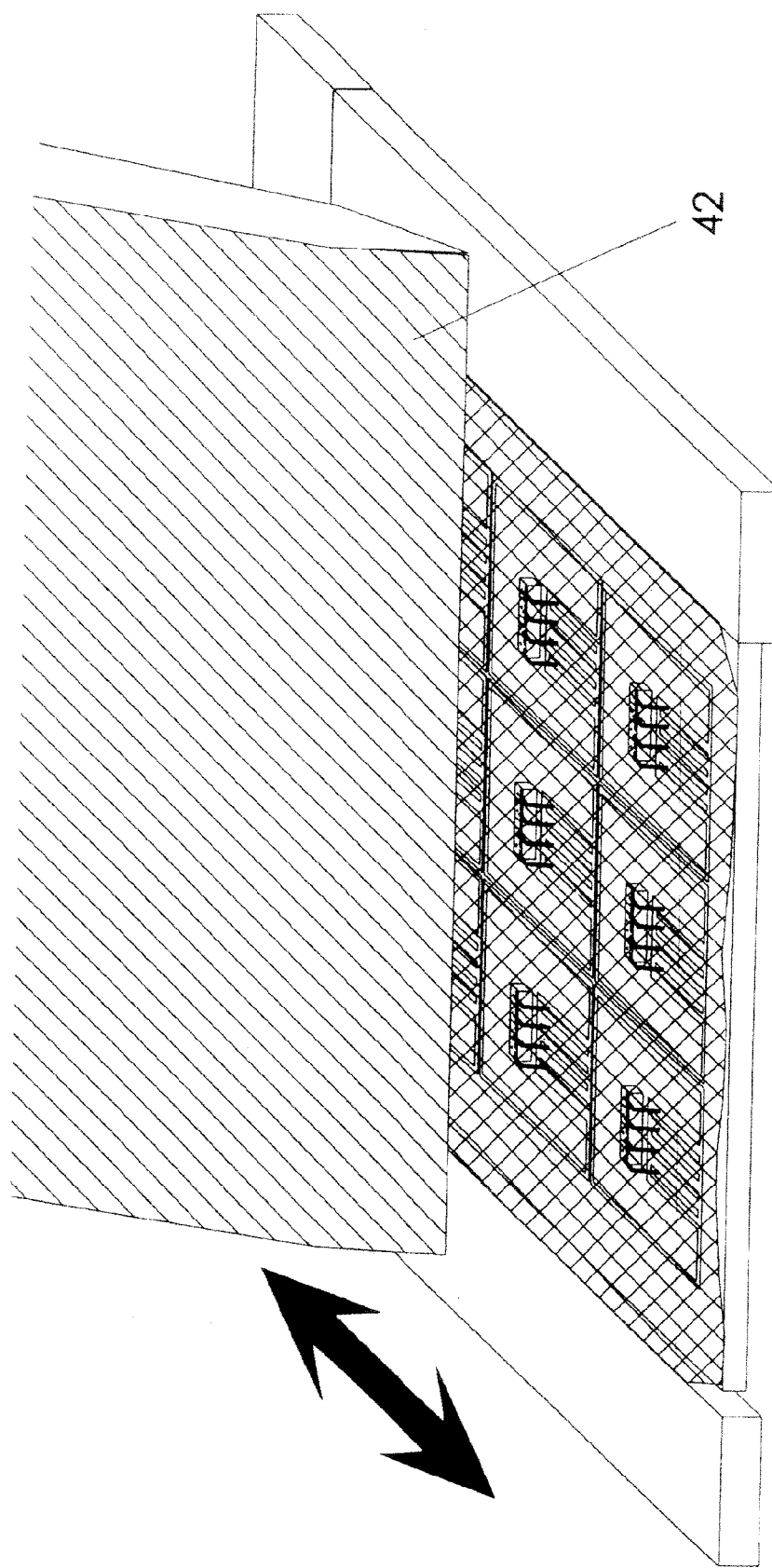
FIG. 14 is a 3D perspective view of the screen-printing process of dragging a rigid squeegee or edge over the optically transparent encapsulating material to produce a thin, flat layer that covers the optoelectronic chips and wirebonds.

Once the substrate is fixed into the assembly rig, the transparent optical material (40), such as the epoxy OG142-17 from Epoxy Technology Inc., can be liberally applied over the surface of the substrate as in FIG. 13. Some care must be taken not to disturb the wirebonds, but this can usually be accomplished by gently pouring the epoxy around and then over the chip and wirebonds. The epoxy can be worked, or squeegeed, multiple times using a tool having a flat edge (42) (e.g., squeegee) until the surface has the desired flatness and is free of defects, more epoxy can be added over the area as well during the squeegee process as in FIG. 14.

Figure 15:
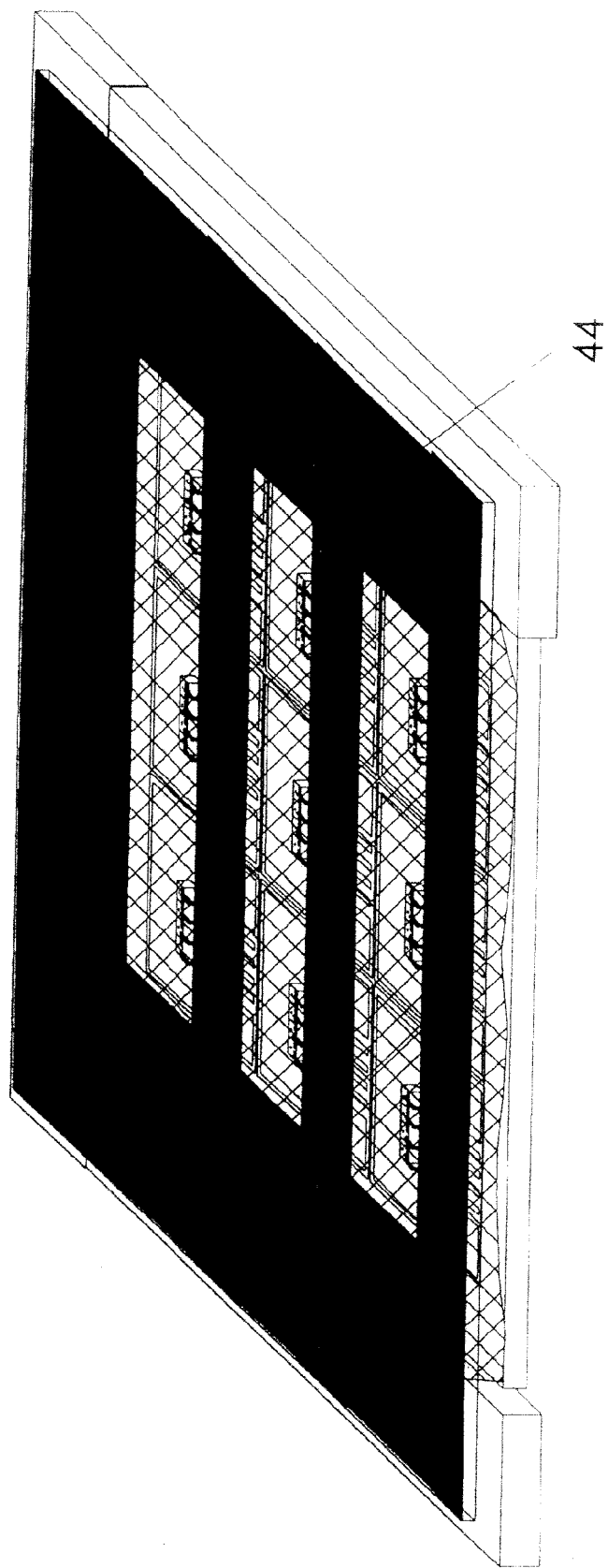
FIG. 15 is a 3D perspective view of the 3×3 array with an opaque mask placed over the optically transparent encapsulating material.
Figure 16:
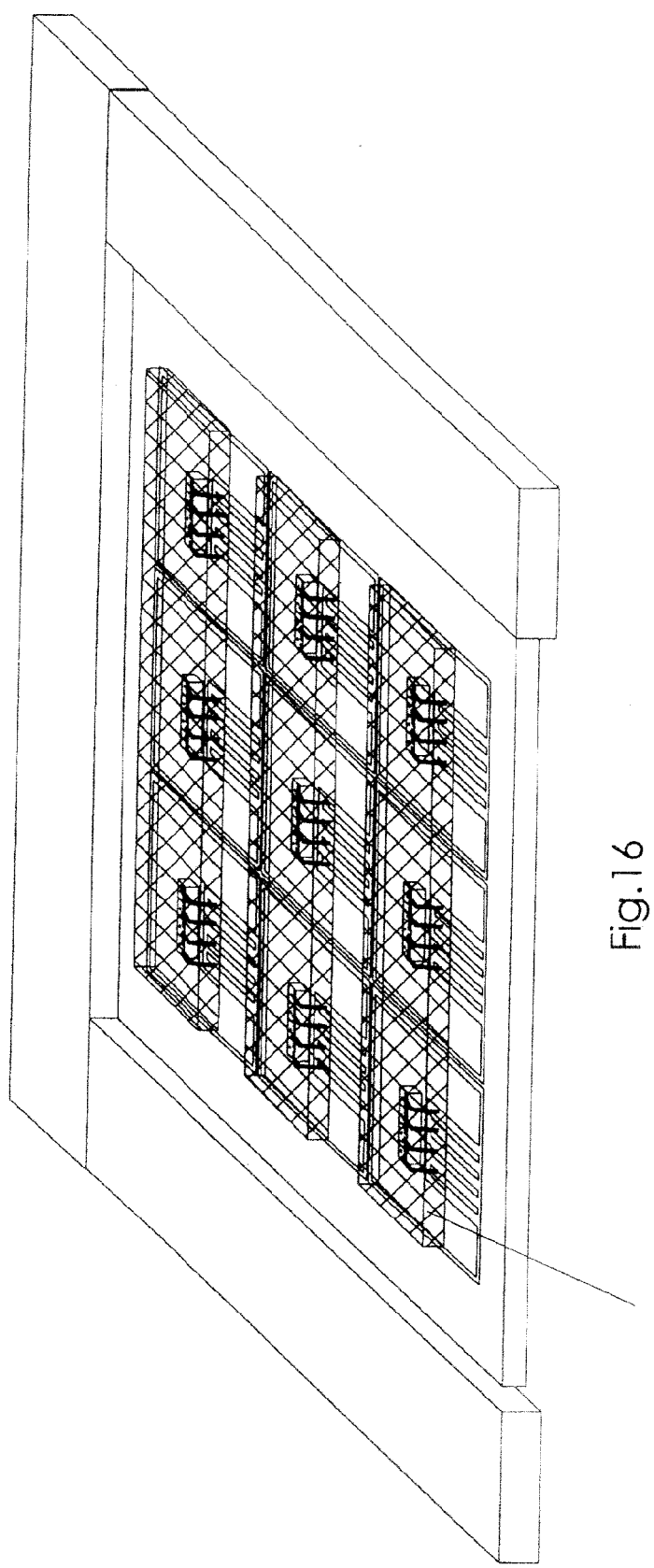
FIG. 16 is a 3D perspective view of several regions of hardened optically transparent encapsulating material.

In the next step, once the epoxy has been flattened and covers all the parts uniformly, the assembly rig and substrate are covered with a mask (44) as in FIG. 15. The mask is typically a rigid glass plate that has opaque areas and transparent areas. The transparent regions of the mask are then centered over regions containing the optoelectronic chips and the opaque regions of the mask are centered over the regions where the bonding fingers are present. The goal is to harden the epoxy over the optoelectronic chips to create the flat optical windows (46), but leave the bonding fingers exposed to air as shown in FIG. 16. Once the epoxy has hardened, the unexposed epoxy can be washed away using ethanol or other gentle cleaning solutions and what remains is the flat encapsulating windows above the chips.

The array can then be cut, diced, snapped or broken into its individual packages (50) as shown in FIG. 17. Two preferred methods of separating these parts are 1) using a wafer dicing saw and cutting each part out of the array, and 2) using pre-cuts or scoring trenches (48) under the substrate so that the parts can be snapped apart.

The embodiments of the invention described above are intended to be exemplary only. The scope of the invention is therefore intended to be limited solely by the scope of the appended claims.

We claim:

1. A screen-printing method of encapsulating an optoelectronic chip on a substrate, the method comprising:
   providing a substrate having an upper surface;
   securing an optoelectronic chip on said upper surface;

on said upper surface, providing borders with a height that surround at least a portion of said optoelectronic chip, said height being determined in accordance with a desired thickness for an optical window;

applying a light transmissible coating over at least a portion of the optoelectronic chip;

squeegeing said coating to create said optical window having said desired thickness, said squeegeing comprising abutting a flat edge tool against top ends of the borders and dragging the flat edge tool on top of the light transmissible coating while maintaining contact with the borders; and allowing said coating to harden, to thereby provide an encapsulated optoelectronic chip on said substrate.

2. The method as in claim 1, further comprising providing more than one of said optoelectronic chip, said optoelectronic chips assembled in an array.

3. The method as in claim 2, further comprising separating said substrate into parts, said parts each having one of said optoelectronic chips.

4. The method as in claim 3, comprising breaking said substrate into said parts.

5. The method as in claim 4, wherein said providing a substrate further comprises providing a substrate having precuts or scoring trenches which are used for said breaking.

6. The method as claimed in claim 1, wherein allowing said coating substance to harden comprises curing said coating substance using ultraviolet illumination.

7. The method as in claim 6, further comprising masking regions of said coating substance prior to said curing.

8. The method as claimed in claim 1, further comprising the step of electrically connecting at least one of a plurality of pins of the optoelectronic chip to a corresponding trace line on said substrate.

9. The method as claimed in claim 1, further comprising choosing a value for said desired thickness that is required for coupling light from the optoelectronic chip to an optical element adjacent to said upper surface.

10. The method as claimed in claim 1, further comprising choosing a value for said determined height that is required for coupling light from the chip to an optical fiber adjacent to said upper surface.

11. The method as claimed in claim 1, wherein said borders comprise removable borders.

12. The method as claimed in claim 1, further comprising polishing said coating to create said optical window.

\* \* \* \* \*

UNITED STATES PATENT AND TRADEMARK OFFICE
CERTIFICATE OF CORRECTION

| | |
|---|---|
| PATENT NO. | : 7,820,462 B2 |
| APPLICATION NO. | : 11/569751 |
| DATED | : October 26, 2010 |
| INVENTOR(S) | : David Robert Cameron Rolston, Tomasz Maj and Shao-Wei Fu |

Page 1 of 1

It is certified that error appears in the above-identified patent and that said Letters Patent is hereby corrected as shown below:

Title Page; item (63);
On the first page the priority information is not listed. It should read that the present US Patent, which is a national phase entry of PCT application WO2005/010580, claims priority from:

US application no. 10/625,906 filed July 24, 2003 &
US application no. 10/725,566 filed December 3, 2003.

Signed and Sealed this
Fifteenth Day of March, 2011

David J. Kappos
*Director of the United States Patent and Trademark Office*